US012747351B2

(12) United States Patent
Endo et al.

(10) Patent No.: US 12,747,351 B2
(45) Date of Patent: Sep. 29, 2026

(54) GAS-BARRIER POLYAMIDE FILM

(71) Applicant: TOYOBO CO., LTD., Osaka (JP)

(72) Inventors: Takuro Endo, Inuyama (JP); Takamichi Goto, Inuyama (JP); Atsushi Yamazaki, Inuyama (JP)

(73) Assignee: TOYOBO CO., LTD., Osaka (JP)

( * ) Notice: Subject to any disclaimer, the term of this patent is extended or adjusted under 35 U.S.C. 154(b) by 0 days.

(21) Appl. No.: 17/631,227

(22) PCT Filed: Jul. 29, 2020

(86) PCT No.: PCT/JP2020/029126
§ 371 (c)(1),
(2) Date: Jan. 28, 2022

(87) PCT Pub. No.: WO2021/039259
PCT Pub. Date: Mar. 4, 2021

(65) Prior Publication Data

US 2022/0259431 A1 Aug. 18, 2022

(30) Foreign Application Priority Data

Aug. 28, 2019 (JP) ............................. JP2019-155630
Sep. 3, 2019 (JP) ............................. JP2019-160425
(Continued)

(51) Int. Cl.
*C08L 77/06* (2006.01)
*B32B 1/00* (2006.01)
(Continued)

(52) U.S. Cl.
CPC ................ *C08L 77/06* (2013.01); *B32B 1/00* (2013.01); *B32B 27/08* (2013.01); *B32B 27/16* (2013.01);
(Continued)

(58) Field of Classification Search
CPC ........... B32B 1/02; B32B 27/34; B32B 27/32; B32B 2307/7244; Y10T 428/1352;
(Continued)

(56) References Cited

U.S. PATENT DOCUMENTS 4,120,928 A 10/1978 Furukawa et al.
5,612,105 A * 3/1997 Okamoto ................ B29C 55/12 428/458
(Continued)

FOREIGN PATENT DOCUMENTS

CN 102947391 A 2/2013
CN 106280431 A * 1/2017
(Continued)

OTHER PUBLICATIONS

Barth, Science Direct, 2011.*
(Continued)

*Primary Examiner* — Aaron Austin
(74) *Attorney, Agent, or Firm* — Leydig, Voit & Mayer, Ltd.

(57) ABSTRACT

Provided is a gas-barrier polyamide film that has excellent bending pinhole resistance and friction pinhole resistance at the same time, that has excellent gas barrier properties, and that is suitable for use for packaging materials. In addition, the environmental load is reduced by using a plant-derived resin as a raw material. A gas-harrier polyamide film comprising an inorganic thin film layer on at least one surface of a biaxially stretched polyamide film containing 99 to 70% by mass of a polyamide 6 resin and 1 to 30% by mass of a polyamide resin in which at least a part of raw material is derived from biomass.

9 Claims, 1 Drawing Sheet

(30) Foreign Application Priority Data

Mar. 12, 2020 (JP) ............................ JP2020-042960
Mar. 12, 2020 (JP) ............................ JP2020-042961

(51) Int. Cl.

| | |
|---|---|
| ***B32B 27/08*** | (2006.01) |
| ***B32B 27/16*** | (2006.01) |
| ***B32B 27/20*** | (2006.01) |
| ***B32B 27/34*** | (2006.01) |
| ***B65D 65/42*** | (2006.01) |
| ***C23C 14/08*** | (2006.01) |
| ***C23C 14/10*** | (2006.01) |
| ***C23C 14/30*** | (2006.01) |

(52) U.S. Cl.
CPC .............. *B32B 27/20* (2013.01); *B32B 27/34* (2013.01); *B65D 65/42* (2013.01); *C23C 14/081* (2013.01); *C23C 14/10* (2013.01); *C23C 14/30* (2013.01); *B32B 2250/24* (2013.01); *B32B 2250/40* (2013.01); *B32B 2255/10* (2013.01); *B32B 2255/20* (2013.01); *B32B 2264/1021* (2020.08); *B32B 2270/00* (2013.01); *B32B 2307/414* (2013.01); *B32B 2307/518* (2013.01); *B32B 2307/554* (2013.01); *B32B 2307/558* (2013.01); *B32B 2307/581* (2013.01); *B32B 2307/7244* (2013.01); *B32B 2307/732* (2013.01); *B32B 2439/46* (2013.01)

(58) Field of Classification Search
CPC ...... Y10T 428/31725; Y10T 428/31855; C08J 7/048; C08J 2377/04; C08L 77/06; C08L 77/02
USPC ............................. 428/35.7, 474.4, 688, 500
See application file for complete search history.

(56) References Cited

U.S. PATENT DOCUMENTS

| | | | | |
|---|---|---|---|---|
| 5,939,205 | A | 8/1999 | Yokoyama et al. | |
| 6,294,263 | B1 | 9/2001 | Okudaira et al. | |
| 6,376,093 | B1 | 4/2002 | Fujita et al. | |
| 9,376,563 | B2 * | 6/2016 | Dullaert | C08L 77/02 |
| 2002/0018905 | A1 | 2/2002 | Okudaira et al. | |
| 2006/0088678 | A1 * | 4/2006 | Berrier | B32B 27/08 428/35.7 |
| 2009/0269532 | A1 * | 10/2009 | Ferreiro | B32B 27/20 428/474.7 |
| 2010/0242801 | A1 | 9/2010 | Lortz et al. | |
| 2011/0072967 | A1 * | 3/2011 | Wood | C08B 37/0012 96/135 |
| 2013/0244047 | A1 | 9/2013 | Stroeks et al. | |
| 2013/0323485 | A1 | 12/2013 | Shimizu et al. | |
| 2014/0030510 | A1 * | 1/2014 | Kimura | C23C 14/584 427/294 |
| 2015/0126349 | A1 * | 5/2015 | Ishihara | B65D 33/02 493/203 |
| 2016/0002419 | A1 | 1/2016 | Miyaguchi | |
| 2018/0265658 | A1 | 9/2018 | Miyaguchi | |
| 2022/0135752 | A1 | 5/2022 | Endo et al. | |
| 2022/0339921 | A1 | 10/2022 | Goto et al. | |

FOREIGN PATENT DOCUMENTS

| | | | |
|---|---|---|---|
| CN | 109825076 | A * | 5/2019 |
| EP | 2975079 | A1 | 1/2016 |
| EP | 4023430 | A1 | 7/2022 |
| EP | 4043214 | A1 | 8/2022 |
| JP | H08-047972 | A | 2/1996 |
| JP | H10-029264 | A | 2/1998 |
| JP | H10-287753 | A | 10/1998 |
| JP | H11-254615 | A | 9/1999 |
| JP | 2001-205761 | A | 7/2001 |
| JP | 2003-181972 | A | 7/2003 |
| JP | 2004-098584 | A | 4/2004 |
| JP | 2004-252401 | A | 9/2004 |
| JP | 2004-255775 | A | 9/2004 |
| JP | 2006-282950 | A | 10/2006 |
| JP | 2007-055159 | A | 3/2007 |
| JP | 2009-119639 | A | 6/2009 |
| JP | 2012-097163 | A | 5/2012 |
| JP | 2014184617 | A * | 10/2014 |
| JP | 2015071668 | A * | 4/2015 |
| JP | 2017-002114 | A | 1/2017 |
| JP | 2019-064075 | A | 4/2019 |
| KR | 10-2015-0065080 | A | 6/2015 |
| TW | 201615404 | A | 5/2016 |
| WO | WO-00/22031 | A1 * | 4/2000 |
| WO | WO 2000/002031 | A | 4/2000 |
| WO | WO 2000/022031 | A | 4/2000 |
| WO | WO 2012/117884 | A1 | 9/2012 |
| WO | WO 2017/209268 | A1 | 12/2017 |

OTHER PUBLICATIONS

Japanese Patent Office, International Search Report in International Patent Application No. PCT/JP2020/029126 (Oct. 6, 2020).
European Patent Office, Extended European Search Report in European Patent Application No. 20856542.4 (Aug. 21, 2023).
Taiwan Intellectual Property Office, First Office Action in Taiwanese Patent Application No. 109125555 (Sep. 8, 2023).
Japan Patent Office, Office Action in Japanese Patent Application No. 2020-519452 (Sep. 12, 2023).
Taiwan Intellectual Property Office, First Office Action in Taiwanese Patent Application No. 109102938 (Sep. 20, 2023).
China National Intellectual Property Administration, Office Action in Chinese Patent Application No. 202080015003.6 (Apr. 13, 2023).
China National Intellectual Property Administration, Third Office Action in Chinese Patent Application No. 202080015003.6 (Jul. 7, 2023).
Arkema, CAMPUS® Database, Rilsan® BMNO PA11 Datasheet [https://www.campusplastics.com/campus/en/datasheet/Rilsan%C2%AE+BMNO/ARKEMA/179/44c2535a] (2021).
Herzog et al., "Polyamides," *Ullmann's Encyclopedia of Industrial Chemistry*, Wily-VCH Verlag Gmbh & Co. KGaA, Weinheim, pp. 1-36 (2013).
China National Intellectual Property Administration, Office Action in Chinese Patent Application No. 202080015003.6 (Nov. 2, 2022).
European Patent Office, Extended European Search Report in European Patent Application No. 20760133.7 (Nov. 7, 2022).
Intellectual Property India, Examination Report in Indian Patent Application No. 202147041851 (Sep. 15, 2022).
Japanese Patent Office, International Search Report in International Patent Application No. PCT/JP2020/002534 (Mar. 24, 2020).
Japan Patent Office, Office Action in Japanese Patent Application No. 2020-562783 (Aug. 30, 2024).
China National Intellectual Property Administration, Rejection Decision in Chinese Patent Application No. 202080015003.6 (Nov. 10, 2023).
China National Intellectual Property Administration, Reexamination Notification in Chinese Patent Application No. 202080015003.6 (Aug. 5, 2024).
Korean Intellectual Property Office, Office Action in Korean Patent Application No. 10-2021-7029138 (Jul. 10, 2024).
Japan Patent Office, Notification of Written Submission of Publications in Japanese Patent Application No. 2020-519452 (Jan. 12, 2024).
Taiwan Intellectual Property Office, Second Office Action in Taiwanese Patent Application No. 109102938 (Jan. 18, 2024).
U.S. Appl. No. 17/431,312, filed Aug. 16, 2021.
China National Intellectual Property Administration, Reexamination Notification in Chinese Patent Application No. 202080015003.6 (Sep. 26, 2024).

(56) References Cited

OTHER PUBLICATIONS

Indonesian Directorate General of Intellectual Property, Office Action in Indonesian Patent Application No. P00202107585 (May 28, 2025).
Indonesian Directorate General of Intellectual Property, Office Action in Indonesian Patent Application No. P00202107585 (Mar. 6, 2025).
Indonesian Directorate General of Intellectual Property, Office Action in Indonesian Patent Application No. P00202107585 (Mar. 20, 2024).
China National Intellectual Property Administration, Office Action in Chinese Patent Application No. 202411829843.2 (May 28, 2026).

* cited by examiner

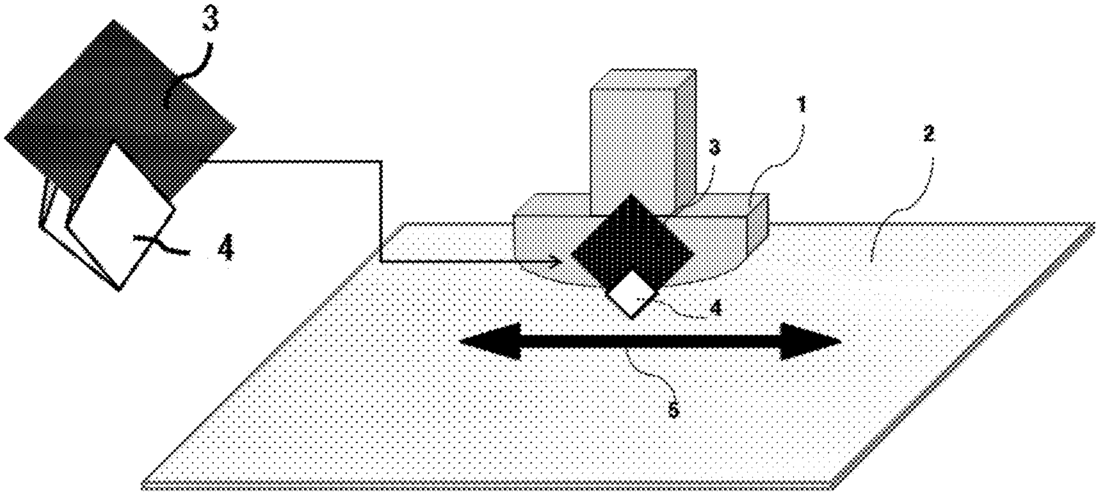
3
4
1
3
2
4
5

GAS-BARRIER POLYAMIDE FILM

TECHNICAL FIELD

The present invention relates to a carbon-neutral gas-barrier polyamide film that has excellent impact resistance, bending pinhole resistance, and friction pinhole resistance, that has excellent gas barrier properties, and for which a raw material derived from biomass is used. The gas-barrier polyamide film of the present invention is suitably used as a film for packaging food, and the like.

BACKGROUND ART

Conventionally, a biaxially stretched film made of an aliphatic polyamide typified by polyamide 6 has excellent impact resistance and bending pinhole resistance, and has been widely used as various packaging material films.

In addition, in order to further improve bending pinhole resistance and impact resistance for filling and packaging liquids such as soups and seasonings, biaxially stretched polyamide films for which various elastomers (rubber components) are mixed with an aliphatic polyamide to make the films more flexible and improve bending pinhole resistance have been widely used.

A film for which a polyamide-based elastomer is mixed with an aliphatic polyamide as a means for improving the above bending pinhole resistance, has been known (see, for example, Patent Literature 1). This film has good bending pinhole resistance and impact resistance in a low temperature environment, and pinholes due to bending fatigue are less likely to occur even in a low temperature environment.

However, pinholes occur not only due to bending but also due to friction (rubbing). The methods for addressing pinholes due to bending and pinholes due to friction often conflict with each other. For example, if the flexibility of the film is increased, bending pinholes are less likely to occur, but pinholes due to friction tends to be more likely to occur due to the increase in flexibility. On the other hand, a laminate for packaging having excellent bending resistance and friction pinhole resistance by providing a surface coating agent on the outer surface of a biaxially stretched polyamide film has been proposed (see, for example, Patent Literature 2). However, this method has little effect of preventing occurrence of friction pinholes. In addition, a coating step is required.

Furthermore, in the case of a film for which a polyamide-based elastomer is mixed with an aliphatic polyamide, the polyamide-based elastomer added during film production is thermally deteriorated, so that deteriorated matter called "meyani" in Japanese (gum-like matter) is likely to be generated at the lip outlet of a die. Then, it has been found that the deteriorated matter causes deterioration of the accuracy of the film thickness. In addition, there has been a problem that the deteriorated matter itself drops to produce a defective product, which decreases the production efficiency during continuous film production.

Meanwhile, a transparent gas-barrier film in which an inorganic oxide thin film is formed on a biaxially stretched polyamide film has been used in a wide range of applications, such as for packaging food, packaging medicines, and packaging electronic devices, as a packaging material through which contents can be seen and which suppresses deterioration of the contents due to oxygen and water vapor (see, for example, Patent Literature 3). A high degree of gas barrier properties is imparted to the gas-barrier film by the inorganic thin film, but there has been a problem that the gas barrier properties are significantly deteriorated when pinholes are formed due to bending or friction.

Meanwhile, in recent years, in order to build a recycling society, the use of biomass instead of fossil fuel raw materials has been attracting attention in the material field. Biomass is an organic compound that is photosynthesized from carbon dioxide and water, and is a so-called carbon-neutral material (which can suppress an increase in carbon dioxide, which is a greenhouse gas, since the amount of carbon dioxide emitted and the amount of carbon dioxide absorbed in the environment are the same) from which carbon dioxide and water are generated when being used. In recent years, the practical use of biomass plastics made from these biomass raw materials has rapidly advanced, and attempts have been made to produce polyester, which is a general-purpose polymer material, from these biomass raw materials.

For example, in the field of polyester film, Patent Literature 4 discloses: a resin composition that contains a polyester composed of a diol unit and a dicarboxylic acid unit and in which a polyester containing ethylene glycol derived from biomass as the diol component unit and a dicarboxylic acid derived from petroleum as the dicarboxylic acid component unit is contained in 50 to 95% by mass with respect to the entire resin composition; and a film.

According to this technology, even with a polyester produced by using ethylene glycol derived from biomass instead of conventional ethylene glycol obtained from fossil fuel, mechanical properties equivalent to those in the case where conventional ethylene glycol derived from fossil fuel is used are obtained.

In such a background, also for polyamide films, a carbon-neutral material for which a raw material derived from biomass is used is required.

PRIOR ART DOCUMENTS

Patent Documents

Patent Document 1: JP hei-11-254615 A
Patent Document 2: JP 2001-205761 A
Patent Document 3: JP hei-10-29264 A
Patent Document 4: JP 2012-097163 A

SUMMARY OF THE INVENTION

Problems to be Solved by the Invention

The present invention has been made to solve the above-described problems of the biaxially stretched polyamide film having improved bending pinhole resistance according to this technology. An object of the present invention is to provide a carbon-neutral biaxially stretched polyamide film that has excellent bending pinhole resistance and friction pinhole resistance at the same time, that has excellent gas barrier properties, and for which a raw material derived from biomass is used.

Solution to the Problems

That is, the present invention has the following configuration.

[1] A gas-barrier polyamide film comprising an inorganic thin film layer on at least one surface of a biaxially stretched polyamide film containing 99 to 70% by mass of a polyamide 6 resin and 1 to 30% by mass of a polyamide resin in which at least a part of raw material is derived from biomass.

[2] A gas-barrier polyamide film comprising an inorganic thin film layer on at least one surface of a biaxially stretched polyamide film in which a functional layer (layer B) is laminated on at least one surface of a base layer (layer A), wherein the base layer (layer A) contains 99 to 70% by mass of a polyamide 6 resin and 1 to 30% by mass of a polyamide resin in which at least a part of raw material is derived from biomass, and the functional layer (layer B) contains 70% by mass or more of the polyamide 6 resin.

[3] The gas-barrier polyamide film according to the above [1] or [2], wherein a content of carbon derived from biomass as measured with radiocarbon ($C^{14}$) is 1 to 15% with respect to total carbon in the biaxially stretched polyamide film.

[4] The gas-barrier polyamide film according to the above [1] or [2], wherein the polyamide resin in which at least a part of the raw material is derived from biomass is at least one polyamide resin selected from the group consisting of polyamide 11, polyamide 410, polyamide 610, and polyamide 1010.

[5] The gas-barrier polyamide film according to the above [1] or [2], wherein the gas-barrier polyamide film satisfies the following (a) and (b):

(a) the number of Gelbo pinhole defects is not larger than 10 when a torsional bending test using a Gelbo flex tester is performed 1000 times at a temperature of 1° C., and (b) a distance to occurrence of a pinhole in a friction-resistant pinhole test is not less than 2900 cm.

[6] The gas-barrier film according to the above [1] or [2], wherein the inorganic thin film layer is a layer made of aluminum oxide or a composite oxide of silicon oxide and aluminum oxide.

[7] A laminated film in which a sealant film is laminated on the gas-barrier polyamide film according to the above [1] or [2].

[8] A packaging bag for which the laminated film according to the above [7] is used.

Effects of the Invention

As for the gas-barrier polyamide film of the present invention, it is possible to provide a polyamide film having excellent bending pinhole resistance and friction pinhole resistance at the same time and having excellent gas barrier properties, by laminating an inorganic thin film layer on at least one surface of a biaxially stretched polyamide film that contains a polyamide 6 resin as a main component and that is obtained by blending a polyamide resin in which a part of raw material is derived from biomass and adopting specific film forming conditions.

Furthermore, in the present invention, unlike a polyamide-based elastomer added in order to improve bending pinhole resistance in the conventional art, the polyamide-based elastomer does not deteriorate inside a die, so that adhesion of deteriorated matter to the inner surface of the die and adhesion of gum-like matter to the lip outlet of the die can be suppressed over a long time. Accordingly, deterioration of the thickness unevenness of the film can be prevented.

Moreover, if deteriorated matter adheres to the inner surface of the die or the lip outlet of the die, the thickness unevenness is deteriorated, so that it is necessary to stop the production and clean the lip of the die. The gas-barrier polyamide film of the present invention can enable continuous production for a long time.

Furthermore, the polyamide resin in which a part of raw material is derived from biomass is used, so that the environmental load can be reduced in terms of not affecting increase or decrease of carbon dioxide on the ground since plants that originally exist on the ground are used as the raw material. In addition, the environmental load can be reduced as compared with a film coated with polyvinylidene chloride as a gas-barrier layer.

BRIEF DESCRIPTION OF THE DRAWING

FIG. 1 is a schematic diagram of a friction pinhole resistance evaluation device.

DESCRIPTION OF THE REFERENCE CHARACTERS

1 head of fastness tester
2 corrugated cardboard
3 mount for holding sample
4 film sample folded in four
5 rubbing amplitude direction

DESCRIPTION OF EMBODIMENTS

Hereinafter, the gas-barrier polyamide film of the present invention will be described in detail.

The gas-barrier polyamide film of the present invention is a gas-barrier polyamide film including an inorganic thin film layer on at least one surface of a biaxially stretched polyamide film containing 99 to 70% by mass of a polyamide 6 resin and 1 to 30% by mass of a polyamide resin in which at least a part of raw material is derived from biomass or a biaxially stretched polyamide film in which the following functional layer (layer B) is laminated on at least one surface of a base layer (layer A) containing 99 to 70% by mass of a polyamide 6 resin and 1 to 30% by mass of a polyamide resin in which at least a part of raw material is derived from biomass.

[Biaxially Stretched Polyamide Film or Base Layer (Layer A)]

For the biaxially stretched polyamide film or the base layer (layer A) in the present invention, by containing 70% by mass or more of the polyamide 6 resin, excellent mechanical strength such as impact strength and excellent gas barrier properties such as for oxygen which a biaxially stretched polyamide film made of the polyamide 6 resin originally has, are obtained.

For the biaxially stretched polyamide film or the base layer (layer A) in the present invention, by containing 1 to 30% by mass of the polyamide resin in which at least a part of raw material is derived from biomass, bending pinhole resistance is improved. In the case of a conventionally used polyamide-based elastomer or polyolefin-based elastomer which is a bending pinhole resistance improving agent, bending pinhole resistance is improved but friction pinhole resistance is deteriorated. By containing 1 to 30% by mass of the polyamide resin in which at least a part of raw material is derived from biomass, a biaxially stretched polyamide film having excellent bending pinhole resistance and friction pinhole resistance at the same time is obtained. In addition, a carbon-neutral film that has little effect on increase or decrease of carbon dioxide on the ground is obtained.

[Polyamide 6 Resin]

Polyamide 6 resin used for the present invention is normally produced by ring-opening polymerization of ε-caprolactam. Polyamide 6 resin obtained by ring-opening polymerization is usually treated with hot water to remove lactam monomer, and then the polyamide 6 is melt extruded from an extruder after dried.

The raw material, ε-caprolactam or aminocaproic acid, is usually derived from fossil fuel.

Relative viscosity of polyamide 6 resin is preferably 1.8 to 4.5, and more preferably 2.6 to 3.2. When the relative viscosity is smaller than 1.8, film has insufficient impact strength. With the relative viscosity larger than 4.5, an unstretched film before stretching becomes hard to be obtained because of the increased load to an extruder.

[Polyamide Resin in which at Least Part of Raw Material is Derived from Biomass]

Examples of the polyamide resin in which at least a part of raw material is derived from biomass and which is used in the present invention include polyamide 11, polyamide 410, polyamide 610, polyamide 1010, a polyamide MXD10 resin, and a polyamide 11/6T copolymer resin.

Polyamide 11 is a polyamide resin having a structure in which a monomer having 11 carbon atoms is bonded via an amide bond. Polyamide 11 is usually obtained using aminoundecanoic acid or undecane lactam as a monomer. In particular, aminoundecanoic acid is preferable from the viewpoint of carbon neutrality since aminoundecanoic acid is a monomer obtained from castor oil. The proportion of the structural units derived from these monomers having 11 carbon atoms is preferably not less than 50%, and further preferably not less than 80%, and may be 100%, of all the structural units in the polyamide 11.

The above polyamide 11 is usually produced by the above-described polymerization of aminoundecanoic acid. The polyamide 11 obtained by polymerization is dried and then melt-extruded by an extruder after lactam is removed with hot water in some cases.

Relative viscosity of polyamide 11 is preferably 1.8 to 4.5, and more preferably 2.4 to 3.2. When the relative viscosity is smaller than 1.8, film has insufficient impact strength. With the relative viscosity larger than 4.5, an unstretched film before stretching becomes hard to be obtained because of the increased load to an extruder.

The polyamide 610 is a polyamide resin having a structure in which a diamine having six carbon atoms and a dicarboxylic acid having ten carbon atoms are polymerized. Usually, hexamethylenediamine and sebacic acid are used. Of these, sebacic acid is preferable from the viewpoint of carbon neutrality since sebacic acid is a monomer obtained from castor oil. The total proportion of the structural units derived from the monomer having six carbon atoms and the structural units derived from the monomer having ten carbon atoms is preferably not less than 50%, and further preferably not less than 80%, and may be 100%, of all the structural units in the PA 610.

The polyamide 1010 is a polyamide resin having a structure in which a diamine having ten carbon atoms and a dicarboxylic acid having ten carbon atoms are polymerized. Usually, 1,10-Decanediamine (Decamethylenediamine) and sebacic acid are used. Of these, Decamethylenediamine and sebacic acid are preferable from the viewpoint of carbon neutrality since Decamethylenediamine and sebacic acid are monomer obtained from castor oil. The total proportion of the structural units derived from the diamine having ten carbon atoms and the structural units derived from the dicarboxylic acid having ten carbon atoms is preferably not less than 50%, and further preferably not less than 80%, and may be 100%, of all the structural units in the PA 1010.

The above polyamide 410 is a polyamide resin having a structure in which a monomer having four carbon atoms and a diamine having ten carbon atoms are copolymerized. Usually, sebacic acid and tetramethylenediamine are used for the polyamide 410. As sebacic acid, one produced from castor oil, which is a vegetable oil, is preferable from an environmental point of view. As the sebacic acid used here, one obtained from castor oil is desirable from the viewpoint of environmental protection (particularly from the viewpoint of carbon neutrality).

The upper limit of the content of the polyamide resin in which at least a part of raw material is derived from biomass, in the biaxially stretched polyamide film or the base layer (layer A) in the present invention, is 30% by mass and more preferably 20% by mass. If the content of the polyamide resin in which at least a part of raw material is derived from biomass exceeds 30% by mass, a melted film becomes unstable when the melted film is cast, so that it becomes difficult to obtain a homogeneous unstretched film.

[Auxiliary Materials, Additives]

The biaxially stretched polyamide film or the base layer (layer A) in the present invention can contain various additives such as another thermoplastic resin, a lubricant, a heat stabilizer, an antioxidant, an antistatic agent, an anti-fogging agent, a UV absorber, a dye, and a pigment, as necessary.

<Other Thermoplastic Resin>

In addition to the above polyamide 6 and the above polyamide resin in which at least a part of raw material is derived from biomass, the biaxially stretched polyamide film or the base layer (layer A) in the present invention can contain another thermoplastic resin as long as the object of the present invention is not impaired. Examples of the other thermoplastic resin include polyamide-based resins such as a polyamide 12 resin, a polyamide 66 resin, a polyamide 6/12 copolymer resin, a polyamide 6/66 copolymer resin, and a polyamide MXD6 resin.

A thermoplastic resin other than polyamide-based resins, for example, a polyester-based polymer such as polyethylene terephthalate, polybutylene terephthalate, and polyethylene-2,6-naphthalate, a polyolefin-based polymer such as polyethylene and polypropylene, or the like may be contained as necessary.

If the raw materials of these thermoplastic resins are derived from biomass, these thermoplastic resins do not affect increase or decrease of carbon dioxide on the ground, and thus the environmental load can be reduced, so that such thermoplastic resins are preferable.

<Lubricant>

The biaxially stretched polyamide film or the base layer (layer A) in the present invention preferably contains an organic lubricant such as fine particles or fatty acid amide as a lubricant in order to improve slipperiness and make the film easier to handle.

The biaxially stretched polyamide film in the present invention also has the effect of reducing breakage of a packaging bag due to friction by improving slipperiness.

The fine particles can be arbitrarily selected from inorganic fine particles such as silica, kaolin, and zeolite, or an organic fine particles such as acrylic-based or polyethylene-based. Silica fine particles are preferably used in terms of transparency and slipperiness.

The average particle diameter of the fine particles is preferably 0.5 to 5.0 μm, and more preferably 1.0 to 3.0 μm. When the average particle diameter is less than 0.5 mm, adding large amount of the particles are required to achieve good slipperiness. When the diameter is larger than 5.0 μm, the surface roughness of the film tends to be too large, resulting in poor appearance.

When silica fine particles are used as the fine particles, the pore volume of silica fine particles are preferably 0.5 to 2.0 ml/g, and more preferably 0.8 to 1.6 ml/g. When the pore volume is less than 0.5 ml/g, void are likely to occur, and film's transparency becomes worse. When the pore volume is larger than 2.0 mug, surface protrusions due to the fine particles tends to be less likely to be generated.

Fatty acid amide and/or fatty acid bisamide can be contained in the biaxially stretched polyamide film or the base layer (layer A) in the present invention for the purpose of improving slipperiness. Examples of the fatty acid amide or fatty acid bisamide are erucic acid amide, stearic acid amide, ethylene bisstearic acid amide, ethylene bisbehenic acid amide, and ethylene bisoleic acid amide.

When the fatty acid amide and/or the fatty acid bisamide is contained, the content amount in the biaxially stretched polyamide film of the present invention is preferably 0.01 to 0.40% by mass, and more preferably 0.05 to 0.30% by mass. When the content amount of the fatty acid amide and/or the fatty acid bisamide is less than the above range, slipperiness of the film tends to be poor. When the amount exceeds the above range, wettability of the film tends to be poor.

A polyamide resin such as a polyamide MXD6 resin, a polyamide 12 resin, a polyamide 66 resin, a polyamide 6/12 copolymer resin, and a polyamide 6/66 copolymer resin can be added to the biaxially stretched polyamide film or the base layer (layer A) in the present invention for the purpose of improving slipperiness. A polyamide MXD6 resin is particularly preferable, and is preferably added in an amount of 1 to 10% by mass.

<Antioxidant>

The biaxially stretched polyamide film or the base layer (layer A) in the present invention can contain an antioxidant.

A phenol-based antioxidant is preferable as the antioxidant. The phenol-based antioxidant is preferably a fully hindered phenol-based compound or a partially hindered phenol-based compound. Examples of such antioxidants include tetrakis-[methylene-3-(3',5'-di-t-butyl-4'-hydroxyphenyl)propionate]methane, stearyl-β-(3,5-di-t-butyl-4-hydroxyphenyl)propionate, and 3,9-bis[1,1-dimethyl-2-[β-(3-t-butyl-4-hydroxy-5-methylphenyl)propionyloxy]ethyl]2,4,8,10-tetraoxaspiro[5,5]undecane.

By containing the above phenol-based antioxidant, the film-forming operability of the biaxially stretched polyamide film is improved. In particular, when a recycled film is used as a raw material, thermal deterioration of the resin is likely to occur, which causes poor film formation operation and tends to increase the production cost. On the other hand, by containing the antioxidant, thermal deterioration of the resin is suppressed and the operability is improved.

[Functional Layer (Layer B)]

As one embodiment of the present invention, the functional layer (layer B) can be laminated on at least one surface of the base layer (layer A) to improve the surface characteristics.

The layer B is a layer containing 70% by mass or more of a polyamide 6 resin.

By containing 70% by mass or more of the polyamide 6 resin in layer B, a biaxially stretched polyamide film having excellent mechanical strength such as impact strength and excellent gas barrier properties such as for oxygen can be obtained.

As the polyamide 6 resin, one that is the same as the polyamide 6 resin used for the above layer A can be used.

The layer B can contain various additives such as another thermoplastic resin, a lubricant, a heat stabilizer, an antioxidant, an antistatic agent, an antifogging agent, a UV absorber, a dye, and a pigment, depending on the function to be provided to the surface of the layer. B.

In the case where the layer B is used on the outer side of a packaging bag, friction pinhole resistance is required, so that it is not preferable to contain a flexible resin such as a polyamide-based elastomer or a polyolefin-based elastomer, or a substance that causes a large number of voids.

In addition to the above polyamide 6, the layer B can contain another thermoplastic resin as long as the object of the present invention is not impaired. Examples of the other thermoplastic resin include polyamide-based resins such as a polyamide MXD6 resin, a polyamide 11 resin, a polyamide 12 resin, a polyamide 66 resin, a polyamide 6/12 copolymer resin, and a polyamide 6/66 copolymer resin.

A thermoplastic resin other than polyamide-based resins, for example, a polyester-based polymer such as polyethylene terephthalate, polybutylene terephthalate, and polyethylene-2,6-naphthalate, a polyolefin-based polymer such as polyethylene and polypropylene, or the like may be contained as necessary.

The layer B preferably contains fine particles, an organic lubricant, or the like as a lubricant in order to improve the slipperiness of the film.

By improving the slipperiness, the handleability of the film is improved and breakage of the packaging bag due to rubbing is reduced.

The fine particles can be arbitrarily selected from inorganic fine particles such as silica, kaolin, and zeolite, or an organic fine particles such as acrylic-based or polyethylene-based. Silica fine particles are preferably used in terms of transparency and slipperiness.

The average particle diameter of the fine particles is preferably 0.5 to 5.0 μm, and more preferably 1.0 to 3.0 μm. When the average particle diameter is less than 0.5 μm, adding large amount of the particles are required to achieve good slipperiness. When the diameter is larger than 5.0 μm, film's surface tends to become too rough, and the film's appearance tends to become worse.

When silica fine particles are used, the pore volume of silica fine particles are preferably 0.5 to 2.0 ml/g, and more preferably 0.8 to 1.6 ml/g. When the pore volume is less than 0.5 ml/g, void are likely to occur, and film's transparency becomes worse. When the pore volume is larger than 2.0 ml/g, surface protrusions due to the fine particles tends to be less likely to be generated.

Fatty acid amide and/or fatty acid bisamide may be contained as the organic lubricant. Examples of the fatty acid amide and/or fatty acid bisamide are erucic acid amide, stearic acid amide, ethylene bisstearic acid amide, ethylene bisbehenic acid amide, and ethylene bisoleic acid amide.

When the fatty acid amide and/or the fatty acid bisamide is contained, the adding content amount in the layer B is preferably 0.01 to 0.40% by mass, and more preferably 0.05 to 0.30% by mass. When the content amount of the fatty acid amide and/or the fatty acid bisamide is less than the above range, slipperiness of the film tends to be poor. When the amount exceeds the above range, wettability of the film tends to be poor.

A polyamide based resin other than polyamide 6, for example, a polyamide MXD6 resin, polyamide 11, a polyamide 12 resin, a polyamide 66 resin, a polyamide 6/12 copolymer resin, a polyamide 6/66 copolymer resin, or the like, can be added to the layer B for the purpose of improving the slipperiness of the film. A polyamide MXD6 resin is particularly preferable, and is preferably added in an amount of 1 to 10% by mass. If the amount of the polyamide-based resin is less than 1% by mass, the effect of improving the slipperiness of the film is small. If the amount of the polyamide-based resin is larger than 10% by mass, the effect of improving the slipperiness of the film is saturated.

A polyamide MXD6 resin is produced by polycondensation of m-xylylenediamine and adipic acid.

The relative viscosity of the polyamide MXD6 is preferably 1.8 to 4.5 and more preferably 2.0 to 3.2. If the relative viscosity is lower than 1.8 or if the relative viscosity is higher than 4.5, it may be difficult to perform kneading with the polyamide resin by the extruder.

In the case where fine particles, an organic lubricant, or a polyamide-based resin such as a polyamide MXD6 resin is added to the layer B for the purpose of improving the slipperiness of the film, when the amount of these added to the base layer (layer A) is decreased, a film having excellent transparency and also excellent slipperiness is obtained, so that it is preferable that the amount of these added to the base layer (layer A) is decreased.

A polyamide-based resin other than polyamide 6 can also be added to the layer B for the purpose of improving adhesiveness. In this case, a copolymerized polyamide resin such as a polyamide 6/12 copolymer resin and a polyamide 6/66 copolymer resin is preferable.

Similar to the above layer A, the layer B of the biaxially stretched polyamide film in the present invention can contain an antioxidant.

As for the method for adding auxiliary materials and additives such as a lubricant and an antioxidant to the biaxially stretched polyamide film or the base layer (layer A) and the functional layer (layer B) in the present invention, the auxiliary materials and the additives can be added at the time of resin polymerization or at the time of melt-extrusion with the extruder. A high concentration masterbatch may be prepared, and may be added to the polyamide resin at the time of film production. The addition can be performed by such a known method.

[Thickness Configuration of Biaxially Stretched Polyamide Film]

The thickness of the biaxially stretched polyamide film in the present invention is not particularly limited, but when the biaxially stretched polyamide film is used as a packaging material, the thickness is usually not thicker than 100 μm, one having a thickness of 5 to 50 μm is generally used, and one having a thickness of 8 to 30 μm is particularly used.

In the thickness configuration of each layer of the biaxially stretched polyamide film in the present invention, if the thickness of the layer B occupies a large part of the total thickness of the film, the bending pinhole resistance is decreased. Therefore, in the present invention, the thickness of the layer A is preferably 50 to 93% and particularly preferably 70 to 93% of the total thickness of the layer A and the layer B.

[Method for Producing Gas-Barrier Polyamide Film]

The gas-barrier polyamide film of the present invention is produced by forming an inorganic thin film layer on the biaxially stretched polyamide film in the present invention by a method described later.

The biaxially stretched polyamide film in the present invention can be manufactured using known production methods. Examples of method for producing the biaxially stretched polyamide film are a sequential biaxial stretching method and a simultaneous biaxial stretching method. The sequential biaxial stretching method is preferable since the sequential biaxial stretching method is capable of increasing a film manufacturing speed, and therefore, has an advantage in terms of cost.

The method of making the biaxially stretched polyamide film in the present invention is described further below.

At first, resin raw material is melt extruded using an extruder and extruded from a T-die forming film. Then, the resin is cast on a cooling roll to be cooled, and an unstretched film is obtained.

Melting temperature of resin is preferably 200 to 300° C. When the temperature is lower than the above, unmelted material is generated, and defect such as poor appearance may be occurred. When the temperature is higher than the above, degradation of resin is observed, and reduced molecular weight and poor appearance may be generated.

The temperature of a cooling roll is preferably −30 to 80° C., more preferably 0 to 50° C. Film shaped molten material is extruded from a T-die, and an unstretched film is obtained by cooling the cast molten material on a cooling rotating drum. To obtain the unstretched film as described above, preferably, the method using an air knife or the electrostatic adhesion method by applying static charge is employed. In particular, the latter method is preferably applied.

The opposite side of the unstretched film of the film cast onto a cooling roll is preferably cooled. For example, the opposite side of the unstretched film may cooled by the following methods. By being contacted with cooling liquid in a vessel, by applying transpiring liquid by a spray nozzle, or by spraying high speed fluid. The methods are preferably applied in combination. The unstretched film obtained in this way is biaxially stretched, and the biaxially stretched polyamide film is obtained.

As a method of stretching in an MD direction, one-stage stretching or multi-stage stretching such as two-stage stretching can be used. As will be described later, multi-stage stretching in the MD direction such as two-stage stretching, rather than one-stage stretching, is preferable in terms of physical properties and uniformity (isotropy) of physical properties in the MD direction and a TD direction.

The stretching in the MD direction in the sequential biaxial stretching method is preferably roll stretching.

The lower limit of the stretching temperature in the MD direction is preferably 50° C., more preferably 55° C., and further preferably 60° C. If the stretching temperature is lower than 50° C., the resin does not soften and stretching may become difficult.

The upper limit of the stretching temperature in the MD direction is preferably 120° C., more preferably 115° C., and further preferably 110° C. If the stretching temperature exceeds 120° C., the resin becomes too soft and stable stretching may not be possible.

The lower limit of the stretching ratio in the MD direction (in the case where stretching is performed in multiple stages, the total stretching ratio obtained by multiplying each ratio) is preferably 2.2 times, more preferably 2.5 times, and further preferably 2.8 times. If the stretching ratio is less than 2.2 times, the thickness accuracy in the MD direction may be decreased, and the degree of crystallinity may become excessively low, decreasing the impact strength.

The upper limit of the stretching ratio in the MD direction is preferably 5.0 times, more preferably 4.5 times, and most preferably 4.0 times. If the stretching ratio exceeds 5.0 times, subsequent stretching may become difficult.

In the case where the stretching in the MD direction is performed in multiple stages, the above-described stretching is possible as each stretching, but as for the stretching ratio, it is necessary to adjust the stretching ratio such that the product of all the stretching ratios in the MD direction is not larger than 5.0. For example, in the case of two-stage stretching, preferably, the first-stage stretching is performed at 1.5 to 2.1 times, and the second-stage stretching is performed at 1.5 to 1.8 times.

The film stretched in the MD direction is stretched in the TD direction with a tenter, is heat-set, and is subjected to a relaxing treatment (also referred to as relaxation treatment).

The lower limit of the stretching temperature in the TD direction is preferably 50° C., more preferably 55° C., and further preferably 60° C. If the stretching temperature is lower than 50° C., the resin does not soften and stretching may become difficult.

The upper limit of the stretching temperature in the TD direction is preferably 190° C., more preferably 185° C., and further preferably 180° C. If the stretching temperature exceeds 190° C., crystallization may occur and stretching may be difficult.

The lower limit of the stretching ratio in the TD direction (in the case where stretching is performed in multiple stages, the total stretching ratio obtained by multiplying each ratio) is preferably 2.8, more preferably 3.2 times, further preferably 3.5 times, and particularly preferably 3.8 times. If the stretching ratio is less than 2.8, the thickness accuracy in the TD direction may be decreased, and the degree of crystallinity may become excessively low, decreasing the impact strength.

The upper limit of the stretching ratio in the TD direction is preferably 5.5 times, more preferably 5.0 times, further preferably 4.7, particularly preferably 4.5, and most preferably 4.3 times. If the stretching ratio exceeds 5.5 times, the productivity may be decreased significantly.

The selection of the heat-setting temperature is an important factor in the present invention. As the heat-setting temperature is increased, crystallization and orientation relaxation of the film proceed, so that the heat shrinkage rate can be reduced. On the other hand, if the heat-setting temperature is low, the crystallization and orientation relaxation are insufficient, so that the heat shrinkage rate cannot be sufficiently reduced. In addition, if the heat-setting temperature becomes excessively high, deterioration of the resin proceeds, so that the toughness of the film such as impact strength is rapidly lost.

The lower limit of the heat-setting temperature is preferably 180° C. and more preferably 200° C. If the heat-setting temperature is low, the heat shrinkage rate becomes excessively high, so that the appearance after lamination tends to be deteriorated, and the lamination strength tends to be decreased.

The upper limit of the heat-setting temperature is preferably 230° C. and more preferably 220° C. If the heat-setting temperature is excessively high, the impact strength tends to be decreased.

The heat-setting time is preferably 0.5 to 20 seconds, and is further preferably 1 to 15 seconds. The heat-setting time can be set to an appropriate time in consideration of the heat-setting temperature and a wind speed in a heat-setting zone. If the heat-setting conditions are excessively weak, the crystallization and orientation relaxation become insufficient, and the above problems arise. If the heat-setting conditions are excessively strong, the film toughness is decreased.

Performing a relaxing treatment after the heat-setting treatment is effective for controlling the heat shrinkage rate. The temperature for the relaxing treatment can be selected in the range from the heat-setting treatment temperature to the glass transition temperature (Tg) of the resin, but is preferably heat-setting treatment temperature—10° C. to Tg+10° C. If the relaxing temperature is excessively high, the shrinkage speed is excessively fast, causing distortion, etc., so that such a relaxing temperature is not preferable. On the other hand, if the relaxing temperature is excessively low, the relaxing treatment is not successfully performed, and mere relaxation occurs, so that the heat shrinkage rate is not decreased and the dimensional stability is deteriorated.

The lower limit of the relaxing rate of the relaxing treatment is preferably 0.5% and more preferably 1%. If the relaxing rate is less than 0.5%, the heat shrinkage rate is not sufficiently decreased in some cases.

The upper limit of the relaxing rate is preferably 20%, more preferably 15%, and further preferably 10%. If the relaxing rate exceeds 20%, sagging may occur in the tenter and the production may become difficult.

In order to increase the adhesive strength with a sealant film or a printed layer, a corona treatment, a flame treatment, or the like may be performed on the surface of the laminated stretched polyamide film.

[Inorganic Thin Film Layer and Formation Method Therefor]

Excellent gas barrier properties can be imparted to the gas-barrier polyamide film of the present invention by providing an inorganic thin film layer on at least one surface of the biaxially stretched polyamide film in the present invention.

The inorganic thin film layer in the gas-barrier film of the present invention and a formation method therefor will be described.

The inorganic thin film layer is a thin film made of metal or an inorganic oxide. The material that forms the inorganic thin film layer is not particularly limited as long as the material can be made into a thin film, but from the viewpoint of transparency and gas barrier properties, an inorganic oxide such as silicon oxide (silica), aluminum oxide (alumina), and a mixture of silicon oxide and aluminum oxide is preferable. From the viewpoint of being able to achieve both flexibility and fineness of the inorganic thin film layer, a composite oxide of silicon oxide and aluminum oxide is particularly preferable. In the composite oxide, as for the mixing ratio of silicon oxide and aluminum oxide, Al is preferably in the range of 20 to 70% by mass in terms of mass ratio of metal content. If the Al concentration is less than 20% by mass, the water vapor barrier property may be decreased. On the other hand, if the Al concentration exceeds 70% by mass, the inorganic thin film layer tends to become hard, and the film may be destroyed during secondary processing such as printing or lamination to decrease the gas barrier properties. Here, the silicon oxide is various silicon oxides such as SiO and $SiO_2$ or mixtures thereof, and the aluminum oxide is various aluminum oxides such as AlO and $Al_2O_3$ and mixtures thereof.

The film thickness of the inorganic thin film layer is usually 1 to 100 nm and preferably 5 to 50 nm. If the film thickness of the inorganic thin film layer is less than 1 nm, it may be difficult to obtain satisfactory gas barrier properties. On the other hand, if the film thickness of the inorganic thin film layer exceeds 100 nm to make the inorganic thin film layer excessively thick, a gas barrier properties improving effect equivalent to this film thickness is not Obtained, so that such a film thickness is disadvantageous in terms of bending resistance and production cost.

The method for forming the inorganic thin film layer is not particularly limited, and, a known vapor deposition method, for example, a physical vapor deposition method (PVD method) such as a vacuum vapor deposition method, a sputtering method, and an ion plating method, or a chemical vapor deposition method (CVD method), may be adopted as appropriate. Hereinafter, a typical method for forming the inorganic thin film layer will be described with a silicon oxide/aluminum oxide-based thin film as an example. For example, in the case where a vacuum vapor deposition method is adopted, a mixture of SiO2 and Al2O3, a mixture of SiO2 and Al, or the like is preferably used as the vapor deposition raw material. Particles are usually used as these vapor deposition raw materials. In this case, the size of each particle is preferably a size in which the pressure during vapor deposition does not change, and the diameter of each particle is preferably 1 mm to 5 mm. For heating, methods such as resistive heating, high frequency induction heating, electron beam heating, and laser heating can be adopted. It is also possible to adopt reactive vapor deposition in which oxygen, nitrogen, hydrogen, argon, carbon dioxide gas, water vapor, or the like is introduced as a reaction gas or a means such as ozone addition or ion assist is used. Furthermore, film production conditions such as applying a bias to a body to be vapor-deposited (laminated film to be vapor-deposited) and heating or cooling the body to be vapor-deposited can be arbitrarily changed. Similarly, the vapor deposition materials, reaction gases, application of a bias to the body to be vapor-deposited, heating/cooling, and the like can be changed even when a sputtering method or a CVD method is adopted.

[Characteristics and the Like of Gas-Barrier Polyamide Film]

For the gas-barrier polyamide film of the present invention in which the inorganic thin film is laminated, the number of pinhole defects by a measurement method described in Examples is preferably not larger than 10 when a torsional bending test using a Gelbo flex tester is performed 1000 times at a temperature of 1° C. The number of pinhole defects is more preferably not larger than 5. The smaller the number of pinhole defects after the bending test, the better the bending pinhole resistance. If the number of pinholes is not larger than 10, a packaging bag in which pinholes are less likely to occur even when a load is applied to the packaging bag during transportation or the like, is obtained.

Furthermore, for the gas-barrier polyamide film of the present invention, the distance to occurrence of a pinhole in a friction-resistant pinhole test is preferably not less than 2900 cm. The distance is more preferably not less than 3100 cm and further preferably not less than 3300 cm. The longer the distance to occurrence of a pinhole, the better the friction pinhole resistance. If the distance to occurrence of a pinhole is not less than 2900 cm, a packaging bag in which pinholes are less likely to occur even when the packaging bag rubs against a cardboard box during transportation or the like, is obtained.

The gas-barrier polyamide film of the present invention is characterized by having excellent characteristics of the above bending pinhole resistance and friction pinhole resistance. The gas-barrier polyamide film according to the embodiment of the present invention having these characteristics is very useful as a packaging film since pinholes are less likely to occur in the gas-barrier polyamide film during transportation.

The heat shrinkage rate of the gas-barrier polyamide film of the present invention at 160° C. for 10 minutes is in the range of 0.6 to 3.0% and preferably 0.6 to 2.5% in both the flow direction (hereinafter abbreviated as MD direction) and the width direction (hereinafter abbreviated as TD direction). If the heat shrinkage rate exceeds 3.0%, curling or shrinkage may occur when heat is applied in the next process such as lamination or printing. In addition, the lamination strength with a sealant film may be weakened. Although it is possible to set the heat shrinkage rate to be less than 0.6%, the film may become mechanically brittle. In addition, the productivity is deteriorated. Thus, such a heat shrinkage rate is not preferable.

Since having excellent impact resistance is a feature of the biaxially stretched polyamide film, the impact strength of the gas-barrier polyamide film of the present invention is preferably not less than 0.7 J/15 μm and more preferably not less than 0.9 J/15 μm.

The haze value of the gas-barrier polyamide film of the present invention is preferably not higher than 10%, more preferably not larger than 7%, and further preferably not larger than 5%.

If the haze value is small, the transparency and gloss are good. Thus, when the gas-barrier polyamide film is used for a packaging bag, beautiful printing is enabled to increase the commercial value.

If fine particles are added in order to improve the slipperiness of the film, the haze value is increased, so that the haze value can be made smaller when the fine particles are added to only the layer B which is a functional layer.

In the gas-barrier polyamide film of the present invention, a content (also referred to as biomass degree) of carbon derived from biomass as measured with radiocarbon ($C^{14}$) according to ASTM D6866-16 is preferably 1 to 15% with respect to the total carbon in the polyamide film.

Since carbon dioxide in the atmosphere contains $C^{14}$ in a fixed ratio (105.5 pMC), the $C^{14}$ content in plants that grow by taking in carbon dioxide in the atmosphere, such as corn, is also known to be about 105.5 pMC. It is also known that fossil fuel contains almost no $C^{14}$. Therefore, the proportion of carbon derived from biomass can be calculated by measuring the proportion of $C^{14}$ contained in all carbon atoms in the polyamide.

The gas-barrier polyamide film of the present invention has a lamination strength of not less than 3.0 N/15 mm after being attached to a polyethylene-based sealant described in Examples.

The gas-barrier polyamide film of the present invention is usually laminated with a sealant film and then processed into a packaging bag. If the above lamination strength is not less than 3.0 N/15 mm, when a packaging bag is produced using the easily adhesive polyamide film of the present invention in various lamination configurations, sufficient strength of a sealed portion is obtained, and a packaging bag that is less likely to be torn is obtained.

In order to make the lamination strength to be not less than 3.0 N/15 mm, a corona treatment, a coating treatment, a flame treatment, or the like can be performed on the gas-barrier polyamide film of the present invention.

Furthermore, in order to improve dimensional stability depending on the application, it is possible to perform a heat treatment or a humidity control treatment on the gas-barrier polyamide film of the present invention. In addition, it is possible to perform a corona treatment, a coating treatment, a flame treatment, or the like and perform printing processing or the like thereon.

[Laminated Film with Sealant Film]

The gas-barrier polyamide film of the present invention is made into a laminated film by laminating a sealant film, etc., and then processed into a packing bag such as a bottom seal bag, a side seal bag, a three side seal bag, a pillow bag, a standing pouch, a gazette bag, and a square bottom bag.

Examples of the sealant film include an unstretched linear low-density polyethylene film, an unstretched polypropylene film, and an ethylene-vinyl alcohol copolymer resin film.

The layer configuration of the laminated film in which the gas-barrier polyamide film of the present invention is used is not particularly limited as long as the gas-barrier polyamide film according to the embodiment of the present invention is included in the laminated film. In addition, the film used in the laminated film may be made of a petrochemical-derived raw material or a biomass-derived raw material, but is preferably made of polylactic acid, polyethylene terephthalate, polybutylene succinate, polyethylene, polyethylene furanoate, or the like, which is polymerized using a raw material derived from biomass, in terms of reducing the environmental load.

Examples of the layer configuration of the laminated film in which the gas-barrier polyamide film of the present invention is used include, when a layer boundary is represented by /, ONY/inorganic thin film layer/adhesive/CPP, PET/adhesive/ONY/inorganic thin film layer/adhesive/LLDPE, PET/adhesive/ONY/inorganic thin film layer/PE/LLDPE, PET/adhesive/ONY/inorganic thin film layer/adhesive/CPP, ONY/inorganic thin film layer/adhesive/PET/adhesive/LLDPE, ONY/inorganic thin film layer/adhesive/PET/PE/LLDPE, ONY/inorganic thin film layer/adhesive/PET/adhesive/CPP, ONY/inorganic thin film layer/PE/LLDPE, ONY/inorganic thin film layer/PE/CPP, OPP/adhesive/ONY/inorganic thin film layer/adhesive/LLDPE, ONY/inorganic thin film layer/adhesive/EVOH/adhesive/LLDPE, ONY/inorganic thin film layer/adhesive/EVOH/adhesive/CPP, and CPP/adhesive/ONY/inorganic thin film layer/adhesive/LLDPE.

The abbreviations used for the above layer configuration are as follows.

ONY/inorganic thin film represents the gas-barrier polyamide film of the present invention, PET represents a stretched polyethylene terephthalate film, LLDPE represents a unstretched linear low-density polyethylene film, CPP represents a unstretched polypropylene film, OPP represents a stretched polypropylene film, PE represents an extruded laminate or unstretched low-density polyethylene film, EVOH represents an ethylene-vinyl alcohol copolymer resin, and adhesive represents an adhesive layer for adhering films to each other.

EXAMPLES

The present invention is hereinafter described in more detail with reference to Examples, but the present invention is not restricted by the following Examples. Film was evaluated based on the following measurement method. Unless otherwise stated, measurement was carried out in a measurement room in an environment of 23° C. and 65% relative humidity.

(1) Haze Value of Film

Haze was measured with a direct reading haze meter manufactured by Toyo Seiki Seisaku-sho, Ltd. according to JIS-K-7105.

(2) Film Thickness

A film was cut into 10 equal parts in the TD direction (as for a narrow film, the film was cut into equal parts such that a width that allows a measurement of a thickness can be ensured). The 10 films were stacked on top of each other, cut into a 100 mm film in the MD direction, and conditioned in an environment at a temperature of 23° C. and a relative humidity of 65% for 2 hours or longer. A thickness at the center of each sample was measured with a thickness measurement device manufactured by TESTER SANGYO CO., LTD., and the average value of the measurements was used as a thickness.

(3) Biomass Degree of Film

The biomass degree of an obtained film was measured with radiocarbon ($C^{14}$) as described in Method B (AMS) of ASTM D6866-16.

(4) Heat Shrinkage Rate of Film

The heat shrinkage rate was measured by the following equation according to the dimensional change test method described in HS C2318, except that the test temperature was set to 160° C. and the heating time was set to 10 minutes.

$$\text{Heat shrinkage rate}=[(\text{length before treatment}-\text{length after treatment})/\text{length before treatment}]\times 100\ (\%)$$

(5) Impact Strength of Film

The impact strength was measured using a film impact tester manufactured by Toyo Seiki Seisaku-sho, Ltd. The measured value was converted into a value in terms of 15 μm thickness and represented in J (joule)/15

(6) Dynamic Friction Coefficient of Film

The dynamic friction coefficient between the outer surfaces of film rolls was evaluated according to JIS-C2151 under the following conditions. The size of a test piece was 130 mm in width and 250 mm in length, and the test speed was 150 mm/min.

(7) Bending Pinhole Resistance of Film

The number of bending fatigue pinholes was measured by the following method using a Gelbo flex tester manufactured by Rigaku Kogyo.

A polyester-based adhesive was applied to the inorganic thin film layer side of each gas-barrier film produced in Examples, then a linear low-density polyethylene film (L-LDPE film: L4102, manufactured by Toyobo Co. Ltd.) having a thickness of 40 μm was dry-laminated thereon, and aging was performed in an environment of 40° C. for 3 days to obtain a laminated film. The obtained laminated film was cut into 12 inches×8 inches and made into a cylindrical shape having a diameter of 3.5 inches with the L-LDPE film side located on the inner side. One end of the cylindrical film was fixed to the fixed head side of the Gelbo flex tester, the other end was fixed to the movable head side, and the initial gripping interval was set to 7 inches. A bending fatigue was applied 1000 times at a rate of 40 times/min such that a 440 degree twist was applied in the first 3.5 inches of a stroke and a straight horizontal motion was made in the subsequent 2.5 inches of the stroke to complete the entire stroke, and the number of pinholes that occurred in the laminated film was counted. The measurement was performed in an environment of 1° C. The test film was placed on a filter paper (Advantech, No. 50) with the L-LDPE film side thereof being a lower surface, and the four corners thereof were fixed with Sellotape (registered trademark). Ink (ink manufactured by PILOT corporation (product number: INK-350-blue), diluted 5-fold with pure water) was applied on the test film and spread all over the surface of the test film using a rubber roller. After wiping off unnecessary ink, the test film was removed, and the number of ink dots on the filter paper was measured as the number of pinholes that occurred in the bending test. The smaller the number of pinholes, the better the bending pinhole resistance.

(8) Friction Pinhole Resistance of Film

A friction test was performed by the following method using a fastness tester (Toyo Seiki Seisaku-sho, Ltd.), and a pinhole occurrence distance was measured.

A laminated film that was the same as one produced in the above bending pinhole resistance evaluation was folded in four to produce a test sample having sharpened corners, and the test sample was rubbed against the inner surface of a corrugated cardboard using the fastness tester at an amplitude of 25 cm and an amplitude rate of 30 times/min with a weight of 100 g. As the corrugated cardboard, one having K280×P180×K210 (AF)=(surface material liner×core material×back material liner (type of flute)) was used.

The pinhole occurrence distance was calculated according to the following procedure. The longer the pinhole occurrence distance, the better the friction pinhole resistance.

First, a friction test was performed at an amplitude of 100 times and a distance of 2500 cm. If no pinhole was formed, a friction test was performed with the number of amplitudes increased by 20 times and with the distance increased by 500 cm. In addition, if no pinhole was formed, a friction test was further performed with the number of amplitudes increased by 20 times and with the distance increased by 500 cm. This was repeated, and the distance at which a pinhole was formed was marked with Q and used as level 1. If a pinhole was formed at an amplitude of 100 times and a distance of 2500 cm, a friction test was performed with the number of amplitudes decreased by 20 times and with the distance decreased by 500 cm. In addition, if a pinhole was formed, a friction test was further performed with the number of amplitudes decreased by 20 times and with the distance decreased by 500 cm. This was repeated, and the distance at which no pinhole was formed was marked with P and used as level 1.

Next, as level 2, in the case of being finally P at level 1, a friction test was performed with the number of amplitudes increased by 20 times, and if no pinhole was formed, P was given, and if a pinhole was formed, Q was given. In the case of being finally Q at level 1, a friction test was performed with the number of amplitudes decreased by 20 times, and if no pinhole was formed, P was given, and if a pinhole was formed, Q was given.

Furthermore, as levels 3 to 20, in the case of being P at the previous level, a friction test was performed with the number of amplitudes increased by 20 times, and if no pinhole was formed, P was given, and if a pinhole was formed, Q was given. In the case of being Q at the previous level, a friction test was performed with the number of amplitudes decreased by 20 times, and if no pinhole was formed, P was given, and if a pinhole was formed, Q was given. This was repeated, and P or Q was given to levels 3 to 20.

For example, the results shown in Table 1 were obtained. A method for obtaining the pinhole occurrence distance will be described using Table 1 as an example.

The number of tests at each distance in which P or Q was given was counted.

The distance having the largest number of times of tests was set as a median, and a coefficient was set to zero. If a distance was longer than this distance, the coefficient was set to +1, +2, +3 . . . per 500 cm, and if a distance was shorter than this distance, the coefficient was set to −1, −2, −3 . . . per 500 cm.

The number of tests in which no hole was formed and the number of tests in which a hole was formed were compared for all the tests from levels 1 to 20, and a friction pinhole occurrence distance was calculated by each of equations in the following cases A and B.

A: case where, in all the tests, the number of tests in which no hole was formed is equal to or more than the number of tests in which a hole was formed.

$$\text{Friction pinhole occurrence distance} = \text{median} + 500 \times (\Sigma(\text{coefficient} \times \text{number of tests in which no hole was formed})/\text{number of tests in which no hole was formed}) + \tfrac{1}{2})$$

B: case where, in all the tests, the number of tests in which no hole was formed is less than the number of tests in which a hole was formed.

$$\text{Friction pinhole occurrence distance} = \text{median} + 500 \times (\Sigma(\text{coefficient} \times \text{number of tests in which hole was formed})/\text{number of tests in which hole was formed}) - \tfrac{1}{2})$$

TABLE 1

| Number of amplitudes | Distance of amplitudes | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|

A: case where, in all the tests, the number of tests (P) in which no hole was formed is equal to or more than the number of tests (Q) in which a hole was formed.
Friction pinhole occurrence distance = median + 500 × (Σ(coefficient × number of tests in which no hole was formed)/number of tests in which no hole was formed) + ½)
Friction pinhole occurrence distance = 3500 + 500 × (−4/10 + ½) = 3550

| Number of amplitudes | Distance of amplitudes | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|
| 180 | 4500 | | | | | | | | | | | | | | |
| 160 | 4000 | | | | | | Q | | Q | | | | | | Q |
| 140 | 3500 | Q | | Q | | P | | P | | Q | | Q | | P | |
| 120 | 3000 | | P | | P | | | | | | P | | P | | |
| 100 | 2500 | | | | | | | | | | | | | | |

B: case where, in all the tests, the number of tests (P) in which no hole was formed is less than the number of tests (Q) in which a hole was formed.
Friction pinhole occurrence distance = median + 500 × (Σ(coefficient × number of tests in which hole was formed)/number of tests in which hole was formed) − ½)
Friction pinhole occurrence distance = 3000 + 500 × (3/11 − ½) = 2880

| Number of amplitudes | Distance of amplitudes | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|
| 160 | 4000 | | | | | | | | | | | | | | |
| 140 | 3500 | | | | | | Q | | Q | | | | | | Q |
| 120 | 3000 | Q | | Q | | P | | P | | Q | | Q | | P | |
| 100 | 2500 | | P | | P | | | | | | P | | P | | |
| 80 | 2000 | | | | | | | | | | | | | | |

| Number of amplitudes | 15 | 16 | 17 | 18 | 19 | 20 | Number of P | Number of Q | Coefficient | Number *coefficient |
|---|---|---|---|---|---|---|---|---|---|---|

A: case where, in all the tests, the number of tests (P) in which no hole was formed is equal to or more than the number of tests (Q) in which a hole was formed.
Friction pinhole occurrence distance = median + 500 × (Σ(coefficient × number of TABLE 1-continued tests in which no hole was formed)/number of tests in which no hole was formed) + ½)
Friction pinhole occurrence distance = 3500 + 500 × (−4⁄10 + ½) = 3550

| | | | | | | | | | | |
|---|---|---|---|---|---|---|---|---|---|---|
| 180 | | | | | | | | | | |
| 160 | | Q | | Q | | Q | 0 | 6 | 1 | 0 |
| 140 | P | | P | | P | | 6 | 4 | 0 | 0 |
| 120 | | | | | | | 4 | 0 | −1 | −4 |
| 100 | | | | | | | | | | |
| | | | | | Total | | 10 | 10 | A | −4 |

B: case where, in all the tests, the number of tests (P) in which no hole was formed is less than the number of tests (Q) in which a hole was formed.
Friction pinhole occurrence distance - median + 500 × (Σ(coefficient × number of tests in which hole was formed)/number of tests in which hole was formed) − ½)
Friction pinhole occurrence distance = 3000 + 500 × (3⁄11 − ½) = 2880

| | | | | | | | | | | |
|---|---|---|---|---|---|---|---|---|---|---|
| 160 | | | | | | | | | | |
| 140 | | Q | | | | | 0 | 4 | 1 | 4 |
| 120 | P | | Q | | Q | | 4 | 6 | 0 | 0 |
| 100 | | | | P | | Q | 5 | 1 | −1 | −1 |
| 80 | | | | | | | | | | |
| | | | | | Total | | 9 | 11 | B | 3 |

(9) Laminate Strength with the Polyethylene-Based Sealant

A laminated film made by a method similar to that described in the description of the bending pinhole resistance evaluation was cut into a strip shape having a width of 15 mm and a length of 200 mm. One end of the laminated film was peeled at the interface between the biaxially stretched polyamide film and the linear low density polyethylene film. The lamination strength was measured 3 times in the MD and TD directions, respectively, using an autograph (manufactured by Shimadzu Corporation) under a condition of a temperature of 23° C., a relative humidity of 50%, a tensile speed of 200 mm/min and a peeling angle of 90°. The lamination strength was evaluated by the average value of the measurements.

(9) Oxygen Transmission Rate

The oxygen transmission rate of a vapor-deposited gas-barrier film was measured under the conditions of 23° C. and a relative humidity of 65% RH according to Method A of JIS K7126-2 using an oxygen transmission rate measurement device ("OX-TRAN 2/21" manufactured by MOCON). In the measurement, the inorganic thin film surface was set on the oxygen gas side.

(13) Relative Viscosity of Raw Material Polyamide

A polyamide solution was prepared by dissolving 0.25 g of polyamide in 96% sulfuric acid in a 25 ml measuring flask so as to have a concentration of 1.0 Oil, and a relative viscosity was measured at 20° C. using the polyamide solution.

(14) Melting Point of Raw Material Polyamide

Measurement was performed according to JIS K7121 using a SSC5200 type differential scanning calorimeter manufactured by Seiko Instruments Inc., in a nitrogen atmosphere with a sample weight of 10 mg, a heating starting temperature of 30° C., and a temperature rising rate of 20° C./min, to obtain an endothermic peak temperature (Tmp) as a melting point.

Example 1-1

Using a device including an extruder and a T-die having a width of 380 mm, the following resin composition melted from the T-die was extruded into a film shape, and was cast and electrostatically adhered to a cooling roll adjusted to 20° C., to obtain an unstretched film having a thickness of 200 μm.

Resin composition: resin composition containing 97 parts by mass of polyamide 6 (manufactured by Toyobo Co., Ltd., relative viscosity: 2.8, melting point: 220° C.), 3.0 parts by mass of polyamide 11 (manufactured by Arkema, relative viscosity: 2.5, melting point: 186° C.), 0.45 parts by mass of porous silica fine particles (manufactured by Fuji Silysia Chemical Ltd., average particle diameter: 2.0 μm, pore volume: 1.6 ml/g), and 0.15 parts by mass of a fatty acid bisamide (ethylene bis stearamide manufactured by Kyoeisha Chemical Co., Ltd.)

The obtained unstretched film was guided to a roll-type stretching machine. The unstretched film was stretched 1.73 times at 80° C. and then further stretched 1.85 times at 70° C. in the MD direction utilizing the difference between the circumferential speeds of rollers. Subsequently, this uniaxially stretched film was guided continuously to a tenter-type stretching machine and preheated at 110° C. Then, the uniaxially stretched film was stretched 1.2 times at 120° C., 1.7 times at 130° C., and 2.0 times at 160° C. in the TD direction, and subjected to a heat setting treatment at 215° C. and then a 7% relaxation treatment at 215° C. Then, the film was wound while a corona treatment was performed on one surface thereof, to obtain a biaxially stretched polyamide film.

The evaluation results of the obtained biaxially stretched polyamide film are shown in Table 2.

Next, a thin film layer of a composite oxide of silicon dioxide and aluminum oxide was formed on the surface, of the obtained biaxially stretched polyamide film, on which the corona treatment had been performed, by the following method.

<Formation of Inorganic Thin Film Layer of Composite Oxide ($SiO_2/Al_2O_3$) of Silicon Dioxide and Aluminum Oxide>

An inorganic thin film layer of a composite oxide of silicon dioxide and aluminum oxide was formed by an electron beam vapor deposition method on the surface, of the obtained biaxially stretched polyamide film, on which the corona treatment had been performed. In the method of vapor deposition, the film was set on the unwinding side of a continuous vacuum vapor deposition machine and was caused to run through a cooling metal drum to wind the film. At this time, the pressure of the continuous vacuum vapor deposition machine was reduced to $10^{-4}$ Torr or lower, and particulate $SiO_2$ (purity: 99.9%) of about 3 mm to 5 mm and $Al_2O_3$ (purity: 99.9%) were used as a vapor deposition source in an alumina crucible below the cooling drum. The film thickness of the obtained inorganic thin film layer ($SiO_2$/$Al_2O_3$ composite oxide layer) was 13 nm. The composition of this composite oxide layer was $SiO_2$/$Al_2O_3$ (mass ratio)=60/40.

The evaluation results of the obtained gas-barrier polyamide film are shown in Table 2.

Example 1-2 to Example 1-5

Biaxially stretched polyamide films and gas-barrier polyamide films were obtained in the same manner as Example 1-1, except that the raw material resin composition was changed as shown in Table 2. The evaluation results of the obtained gas-barrier polyamide films are shown in Table 2.

However, in Example 1-6 and Example 1-7, an inorganic thin film layer of aluminum oxide was formed as an inorganic thin film layer by the following method.

<Formation of Inorganic Thin Film Layer of Aluminum Oxide ($Al_2O_3$)>

An inorganic thin film layer of aluminum oxide was formed by an electron beam vapor deposition method on the surface, of the obtained biaxially stretched polyamide film, on which the corona treatment had been performed. In the method of vapor deposition of aluminum oxide, the film was set on the unwinding side of a continuous vacuum vapor deposition machine and was caused to run through a cooling metal drum to wind the film. At this time, the pressure of the continuous vacuum vapor deposition machine was reduced to $10^{-4}$ Torr or lower, and metal aluminum having a purity of 99.99% was put into an alumina crucible below the cooling drum, was heated and evaporated, and was adhered and deposited on the film while oxygen was supplied into the vapor of the metal aluminum to cause an oxidation reaction, to form an aluminum oxide film having a thickness of 30 nm.

Comparative Example 1-1 to Comparative Example 1-5

Biaxially stretched polyamide films and gas-barrier polyamide films were obtained in the same manner as Example 1 with the raw material blending compositions shown in Table 2. The evaluation results of the obtained gas-barrier polyamide films are shown in Table 2.

However, in Comparative Example 1-3, the melted resin was not able to be stably extruded from the T-die into a film shape, and a homogeneous unstretched film was not obtained, so that biaxial stretching was not able to be performed.

In Comparative Example 1-4, a polyamide elastomer which is conventionally used as a modifier for bending pinhole resistance was blended.

In Comparative Example 1-5, an inorganic thin film layer was not formed.

TABLE 2

| | | | Example | | | | | |
|---|---|---|---|---|---|---|---|---|
| | | | 1-1 | 1-2 | 1-3 | 1-4 | 1-5 | 1-6 |
| Composition | polyamide 6 | % by mass | 96.4 | 94.4 | 89.5 | 84.5 | 74.6 | 94.4 |
| | polyamide 11 | % by mass | 3.0 | 5.0 | 9.9 | 14.9 | 24.9 | 5.0 |
| | polyamide elastomer | % by mass | — | — | — | — | — | — |
| | fine particle | % by mass | 0.45 | 0.45 | 0.45 | 0.45 | 0.45 | 0.45 |
| | fatty acid amide | % by mass | 0.15 | 0.15 | 0.15 | 0.15 | 0.15 | 0.15 |
| Inorganic thin film layer | | — | aluminum oxide + silicon dioxide | aluminum oxide + silicon dioxide | aluminum oxide + silicon dioxide | aluminum oxide + silicon dioxide | aluminum oxide + silicon dioxide | aluminum oxide |
| Thickness | | μm | 15 | 15 | 15 | 15 | 15 | 15 |
| Haze | | % | 2.3 | 2.5 | 2.8 | 2.9 | 4.5 | 2.6 |
| Impact strength | | J/15 μm | 1.1 | 1.1 | 1.1 | 1.0 | 1.1 | 1.1 |
| Heat shrinkage rate | MD | % | 0.9 | 1.0 | 1.0 | 1.1 | 1.3 | 0.9 |
| | TD | % | 0.9 | 0.9 | 1.0 | 1.2 | 1.3 | 0.9 |
| Bending pinhole resistance | | piece | 7 | 4 | 4 | 4 | 4 | 3 |
| Friction pinhole resistance | | cm | 3300 | 3250 | 3100 | 3150 | 3100 | 3300 |
| Lamination strength | MD | N/15 mm | 6.5 | 6.8 | 7.2 | 7.4 | 7.2 | 6.9 |
| | TD | N/15 mm | 6.6 | 6.8 | 7.1 | 7.0 | 6.9 | 6.9 |
| Oxygen transmission rate | $ml/m^2 \cdot day \cdot MPa$ | | 21 | 25 | 23 | 28 | 22 | 44 |

| | | | Example | Comparative Example | | | | |
|---|---|---|---|---|---|---|---|---|
| | | | 1-7 | 1-1 | 1-2 | 1-3 | 1-4 | 1.5 |
| Composition | polyamide 6 | % by mass | 89.5 | 99.4 | 98.9 | 64.6 | 96.4 | 94.4 |
| | polyamide 11 | % by mass | 9.9 | — | 0.5 | 34.8 | — | 5.0 |
| | polyamide elastomer | % by mass | — | — | | — | 3.0 | — |
| | fine particle | % by mass | 0.45 | 0.45 | 0.45 | 0.45 | 0.45 | 0.45 |
| | fatty acid amide | % by mass | 0.15 | 0.15 | 0.15 | 0.15 | 0.15 | 0.15 |
| Inorganic thin film layer | | — | aluminum oxide | aluminum oxide + silicon dioxide | aluminum oxide + silicon dioxide | — | aluminum oxide + silicon dioxide | None |
| Thickness | | μm | 15 | 15 | 15 | — | 15 | 15 |
| Haze | | % | 2.7 | 2.1 | 2.2 | — | 2.4 | 2.6 |
| Impact strength | | J/15 μm | 1.1 | 0.83 | 0.86 | — | 1.2 | 1.2 |
| Heat shrinkage rate | MD | % | 1.0 | 0.9 | 1.0 | — | 1.1 | 0.9 |
| | TD | % | 1.0 | 0.8 | 0.8 | — | 1.2 | 0.9 |
| Bending pinhole resistance | | piece | 4 | 18 | 16 | — | 3 | 4 |
| Friction pinhole resistance | | cm | 3100 | 3150 | 3100 | — | 2600 | 3250 |

TABLE 2-continued

| | | | | | | | | |
|---|---|---|---|---|---|---|---|---|
| Lamination strength | MD | N/15 mm | 7.0 | 4.8 | 5.0 | — | 4.5 | 6.7 |
| | TD | N/15 mm | 6.7 | 4.5 | 4.9 | — | 4.2 | 6.5 |
| Oxygen transmission rate | ml/m$^2$ · day · MPa | | 46 | 23 | 25 | — | 28 | >500 |

As shown in Table 2, the gas-barrier polyamide film of each Example was obtained as a film having good bending pinhole resistance and friction pinhole resistance. In addition, the haze was low, the transparency was good, the impact strength was strong, and the lamination strength with the sealant film was high, so that the gas-barrier polyamide film was excellent as a packaging film.

The gas-barrier films of Comparative Example 1-1 and Comparative Example 1-2 in each of which an inorganic thin film was formed on a biaxially stretched polyamide film containing no material for modifying bending pinhole resistance or on a biaxially stretched polyamide film having an excessively low content of polyamide 11, had inferior bending pinhole resistance.

In Comparative Example 1-3, since the content of polyamide 11 was excessively high, the melted resin was not able to be stably extruded from the T-die into a film shape, so that a homogeneous unstretched film was not obtained, and a biaxially stretched polyamide film was not obtained.

In Comparative Example 1-4, the polyamide elastomer which is conventionally used as a material for modifying bending pinhole resistance was used. The Obtained gas-barrier polyamide film had good bending pinhole resistance but inferior friction pinhole resistance.

In Comparative Example 1-5, since an inorganic thin film layer was not formed, the oxygen transmission rate was high, so that the gas-barrier polyamide film was not suitable for gas-barrier packaging.

Example 2-1 to Example 2-9

Biaxially stretched polyamide films and gas-barrier polyamide films were obtained in the same manner as Example 1-1, except that the raw material resin composition and the inorganic thin film layer were changed as shown in Table 3. The evaluation results of the obtained gas-barrier polyamide films are shown in Table 3.

However, in Example 2-6, similar to Example 1-6, an inorganic thin film layer of aluminum oxide was formed as an inorganic thin film layer.

Comparative Example 2-1 to Comparative Example 2-5

Biaxially stretched polyamide films and gas-barrier polyamide films were obtained in the same manner as Example 1 with the raw material blending compositions shown in Table 3. The evaluation results of the obtained gas-barrier polyamide films are shown in Table 3.

However, in Comparative Example 2-2, an inorganic thin film layer was not formed.

In Comparative Example 2-4, when the content of polyamide 11 as a polyamide resin in which at least a part of raw material is derived from biomass was set to 35% by mass, the melted resin was not able to be stably extruded from the T-die into a film shape, and a homogeneous unstretched film was not obtained. Therefore, a biaxially stretched film was not obtained.

In Comparative Example 2-5, a polyamide elastomer which is conventionally used as a modifier for bending pinhole resistance was blended.

TABLE 3

| | | | Example | | | | | | |
|---|---|---|---|---|---|---|---|---|---|
| | | | 2-1 | 2-2 | 2-3 | 2-4 | 2-5 | 2-6 | 2-7 |
| Composition | polyamide 6 | % by mass | 97 | 95 | 90 | 85 | 75 | 95 | 95 |
| | polyamide 11 | % by mass | 3 | 5 | 10 | 15 | 25 | 5 | — |
| | polyamide 410 | % by mass | — | — | — | — | — | — | — |
| | polyamide 610 | % by mass | — | — | — | — | — | — | — |
| | polyamide 1010 | % by mass | — | — | — | — | — | — | — |
| | polyamide elastomer | % by mass | — | — | — | — | — | — | — |
| | fine particle | % by mass | 0.45 | 0.45 | 0.45 | 0.45 | 0.45 | 0.45 | 0.45 |
| | fatty acid amide | % by mass | 0.15 | 0.15 | 0.15 | 0.15 | 0.15 | 0.15 | 0.15 |
| Inorganic thin film layer | | — | aluminum oxide + silicon dioxide | aluminum oxide + silicon dioxide | aluminum oxide + silicon dioxide | aluminum oxide + silicon dioxide | aluminum oxide + silicon dioxide | aluminum oxide | aluminum oxide + silicon dioxide |
| Film thickness | | μm | 15 | 15 | 15 | 15 | 15 | 15 | 15 |
| Biomass degree | | % | 3 | 5 | 10 | 15 | 25 | 5 | 4 |
| Haze | | % | 2.4 | 2.6 | 2.9 | 3.1 | 4.9 | 2.8 | 3.3 |
| Impact strength | | J/15 μm | 1.3 | 1.2 | 1.2 | 1.2 | 1.1 | 1.2 | 1.2 |
| Bending pinhole resistance | | piece | 3 | 3 | 5 | 4 | 4 | 3 | 5 |
| Friction pinhole resistance | | cm | 3050 | 3300 | 3130 | 3100 | 3010 | 3200 | 3100 |
| Heat shrinkage rate | MD direction | % | 0.9 | 1.1 | 0.9 | 1.1 | 1.2 | 1.0 | 1.4 |
| | TD direction | % | 0.9 | 1.0 | 1.1 | 1.4 | 1.2 | 1.0 | 1.4 |
| Lamination strength | MD direction | N/mm | 6.8 | 6.4 | 7.4 | 7.1 | 7.2 | 7.2 | 6.5 |
| | TD direction | N/mm | 6.5 | 6.5 | 7.0 | 7.1 | 6.9 | 6.8 | 7.1 |
| Oxygen transmission rate | ml/m$^2$ · day · MPa | | 20 | 25 | 23 | 27 | 27 | 47 | 26 |

TABLE 3-continued

| | | | Example | | Comparative Example | | | | |
|---|---|---|---|---|---|---|---|---|---|
| | | | 2-8 | 2-9 | 2-1 | 2-2 | 2-3 | 2-4 | 2-5 |
| Composition | polyamide 6 | % by mass | 95 | 95 | 100 | 100 | 99.5 | 65 | 97 |
| | polyamide 11 | % by mass | — | — | — | — | 0.5 | 35 | — |
| | polyamide 410 | % by mass | — | — | — | — | — | — | — |
| | polyamide 610 | % by mass | — | — | — | — | — | — | — |
| | polyamide 1010 | % by mass | — | — | — | — | — | — | — |
| | polyamide elastomer | % by mass | — | — | — | — | — | — | — |
| | fine particle | % by mass | 0.45 | 0.45 | 0.45 | 0.45 | 0.45 | 0.45 | 0.45 |
| | fatty acid amide | % by mass | 0.15 | 0.15 | 0.15 | 0.15 | 0.15 | 0.15 | 0.15 |
| Inorganic thin film layer | | — | aluminum oxide + silicon dioxide | aluminum oxide + silicon dioxide | aluminum oxide + silicon dioxide | None | aluminum oxide + silicon dioxide | — | aluminum oxide + silicon dioxide |
| Film thickness | | μm | 15 | 15 | 15 | 15 | 15 | 15 | 15 |
| Biomass degree | | % | 3 | 3 | 0.0 | 0.0 | 0.5 | 35 | 0.0 |
| Haze | | % | 3.4 | 3.3 | 2.1 | 2.3 | 2.3 | — | 2.3 |
| Impact strength | | J/15 μm | 1.2 | 1.2 | 0.9 | 1.2 | 0.9 | — | 1.2 |
| Bending pinhole resistance | | piece | 6 | 6 | 20 | 20 | 17 | — | 3 |
| Friction pinhole resistance | | cm | 3320 | 3300 | 2820 | 2800 | 2890 | — | 2700 |
| Heat shrinkage rate | MD direction | % | 1.4 | 1.5 | 0.8 | 1.0 | | — | 1.1 |
| | TD direction | % | 1.5 | 1.5 | 0.8 | 1.1 | 0.9 | — | 1.3 |
| Lamination strength | MD direction | N/mm | 7.2 | 6.9 | 6.7 | 3.0 | 6.3 | — | 4.4 |
| | TD direction | N/mm | 7.0 | 7.0 | 6.8 | 3.4 | 6.6 | — | 4.3 |
| Oxygen transmission rate | $ml/m^2 \cdot day \cdot MPa$ | | 23 | 25 | 23 | >500 | 28 | — | 29 |

As shown in Table 3, the gas-barrier polyamide film of each Example was obtained as a film having good bending pinhole resistance and friction pinhole resistance. In addition, the haze was low, the transparency was good, the impact strength was strong, and the lamination strength with the sealant film was high, so that the gas-barrier polyamide film was excellent as a packaging film.

The gas-barrier film of Comparative Example 2-1 in which an inorganic thin film was formed on a biaxially stretched polyamide film containing no material for modifying bending pinhole resistance, and the gas-barrier film of Comparative Example 2-3 in which an inorganic thin film was formed on a biaxially stretched polyamide film having an excessively low content of polyamide 11, which is a polyamide resin in which at least a part of raw material is derived from biomass, had inferior bending pinhole resistance.

In Comparative Example 2-2, since an inorganic thin film was not formed, the oxygen transmission rate was high and the gas barrier properties were significantly inferior.

In Comparative Example 2-4, since the content of polyamide 11 was excessively high, the melted resin was not able to be stably extruded from the T-die into a film shape, so that a homogeneous unstretched film was not obtained, and a biaxially stretched polyamide film was not obtained.

In Comparative Example 2-5, the polyamide elastomer which is conventionally used as a material for modifying bending pinhole resistance was used. The obtained gas-barrier polyamide film had good bending pinhole resistance but inferior friction pinhole resistance.

Example 3-1

Using a device including two extruders and a co-extruding T-die having a width of 380 mm, lamination was performed in a layer B/layer A/layer B configuration by a feed block method, and a melted resin was extruded from the T-die into a film shape, and was cast and electrostatically adhered to a cooling roll adjusted to 20° C., to obtain an unstretched film having a thickness of 200 μm.

The resin compositions of the layer A and the layer B are as follows.

Resin composition forming layer A: polyamide resin composition containing 97 parts by mass of polyamide 6 (manufactured by Toyobo Co., Ltd., relative viscosity: 2.8, melting point: 220° C.) and 3.0 parts by mass of polyamide 11 (manufactured by Arkema, relative viscosity: 2.5, melting point: 186° C.)

Resin composition forming layer B: resin composition containing 95 parts by mass of polyamide 6 (manufactured by Toyobo Co., Ltd., relative viscosity: 2.8, melting point: 220° C.), 5.0 parts by mass of polyamide MXD6 (manufactured by MITSUBISHI GAS CHEMICAL COMPANY, INC., relative viscosity: 2.1, melting point: 237° C.), 0.54 parts by mass of porous silica fine particles (manufactured by Fuji Silysia Chemical Ltd., average particle diameter: 2.0 μm, pore volume: 1.6 ml/g), and 0.15 parts by mass of a fatty acid bisamide (ethylene bis stearamide manufactured by Kyoeisha Chemical Co., Ltd.)

As for the thickness of the biaxially stretched polyamide film, the structure of the feed Hock and the discharge quantities of the extruders were adjusted such that the biaxially stretched polyamide film had a total thickness of 15 μm, the base layer (layer A) had a thickness of 12 μm, and the surface layers (layers B) on the front and back sides each had a thickness of 1.5 μm.

The obtained unstretched film was guided to a roll-type stretching machine. The unstretched film was stretched 1.73 times at 80° C. and then further stretched 1.85 times at 70° C. in the MD direction utilizing the difference between the circumferential speeds of rollers. Subsequently, this uniaxially stretched film was guided continuously to a tenter-type stretching machine and preheated at 110° C. Then, the uniaxially stretched film was stretched 1.2 times at 120° C., 1.7 times at 130° C., and 2.0 times at 160° C. in the TD direction, and subjected to a heat setting treatment at 215° C. and then a 7% relaxation treatment at 215° C. Then, the film was wound while a corona treatment was performed on one surface thereof; to obtain a biaxially stretched polyamide film.

Next, a thin film layer of a composite oxide of silicon dioxide and aluminum oxide was formed on the surface, of the obtained biaxially stretched polyamide film, on which the corona treatment had been performed, by the same method as in Example 1-1.

Example 3-2 to Example 3-9

Biaxially stretched polyamide films and gas-barrier polyamide films were obtained in the same manner as Example 3-1, except that the raw material resin composition was changed as shown in Table 4. The evaluation results of the obtained gas-barrier polyamide films are shown in Table 4.

However, in Example 3-6 and Example 3-7, similar to Example 1-6, an inorganic thin film layer of aluminum oxide was formed as an inorganic thin film layer.

Comparative Example 3-1 to Comparative Example 3-5

Biaxially stretched polyamide films and gas-barrier polyamide films were obtained in the same manner as Example 3-1 with the raw material blending compositions shown in Table 4. The evaluation results of the obtained gas-barrier polyamide films are shown in Table 4.

However, in Comparative Example 3-3, the melted resin was not able to be stably extruded from the T-die into a film shape, and a homogeneous unstretched film was not obtained, so that a biaxially stretched polyamide film was not obtained.

In Comparative Example 3-4, a polyamide elastomer which is conventionally used as a modifier for bending pinhole resistance was blended.

In Comparative Example 3-5, an inorganic thin film layer was not formed.

TABLE 4

| | | | Example | | | | | | |
|---|---|---|---|---|---|---|---|---|---|
| | | | 3-1 | 3-2 | 3-3 | 3-4 | 3-5 | 3-6 | 3-7 |
| Composition of base layer | polyamide 6 | % by mass | 97 | 95 | 90 | 85 | 75 | 95 | 95 |
| | polyamide 11 | % by mass | 3 | 5 | 10 | 15 | 25 | 5 | 5 |
| | polyamide elastomer | % by mass | — | — | — | — | — | — | — |
| Composition of functional layer | polyamide 6 | % by mass | 95 | 95 | 97 | 95 | 95 | 100 | 90 |
| | polyamide 11 | % by mass | 5 | 5 | 3 | 5 | 5 | — | 10 |
| | polyamide elastomer | % by mass | — | — | — | — | — | — | — |
| | fine particle | % by mass | 0.54 | 0.54 | 0.54 | 0.54 | 0.54 | 0.65 | 0.54 |
| | fatty acid amide | % by mass | 0.15 | 0.15 | 0.15 | 0.15 | 0.15 | 0.20 | 0.15 |
| Total thickness | | μm | 15 | 15 | 15 | 15 | 15 | 15 | 15 |
| Thickness of base layer | | μm | 12 | 12 | 12 | 12 | 12 | 12 | 12 |
| Inorganic thin film layer | | — | aluminum oxide + silicon dioxide | aluminum oxide + silicon dioxide | aluminum oxide + silicon dioxide | aluminum oxide + silicon dioxide | aluminum oxide + silicon dioxide | aluminum oxide + silicon dioxide | aluminum oxide + silicon dioxide |
| Haze | | % | 1.9 | 2.1 | 2.3 | 2.6 | 4.1 | 2.3 | 2.4 |
| Impact strength | | J/15 μm | 1.1 | 1.1 | 1.3 | 1.3 | 1.5 | 1.2 | 1.2 |
| Heat shrinkage rate | MD direction | % | 0.9 | 0.9 | 0.9 | 1.0 | 1.3 | 0.9 | 0.9 |
| | TD direction | % | 1.0 | 1.0 | 1.1 | 1.2 | 1.3 | 1.0 | 1.0 |
| Dynamic friction coefficient (F/B) | | — | 0.66 | 0.63 | 0.71 | 0.70 | 0.70 | 0.54 | 0.58 |
| Bending pinhole resistance | | piece | 6 | 4 | 3 | 4 | 5 | 8 | 5 |
| Friction pinhole resistance | | cm | 3200 | 3400 | 3100 | 3300 | 3400 | 3200 | 3300 |
| Lamination strength | MD direction | N/15 mm | 7.0 | 6.8 | 7.3 | 7.0 | 6.9 | 6.2 | 7.5 |
| | TD direction | N/15 mm | 6.7 | 6.6 | 7.0 | 6.9 | 7.1 | 6.1 | 7.3 |
| Oxygen transmission rate | ml/m$^2$ · day · MPa | | 23 | 26 | 22 | 24 | 28 | 22 | 25 |

| | | | Example | | Comparative Example | | | | |
|---|---|---|---|---|---|---|---|---|---|
| | | | 3-8 | 3-9 | 3-1 | 3-2 | 3-3 | 3-4 | 3-5 |
| Composition of base layer | polyamide 6 | % by mass | 95 | 90 | 100 | 99.5 | 65 | 95 | 95 |
| | polyamide 11 | % by mass | 5 | 10 | — | 0.5 | 35 | — | 5 |
| | polyamide elastomer | % by mass | — | — | — | — | — | 3 | — |

TABLE 4-continued

| | | | | | | | | | |
|---|---|---|---|---|---|---|---|---|---|
| Composition of functional layer | polyamide 6 | % by mass | 95 | 95 | 100 | 95 | 95 | 95 | 95 |
| | polyamide 11 | % by mass | 5 | 5 | — | 5 | 5 | — | 5 |
| | polyamide elastomer | % by mass | — | — | — | — | — | 3 | — |
| | fine particle | % by mass | 0.54 | 0.54 | 0.54 | 0.54 | 0.54 | 0.54 | 0.54 |
| | fatty acid amide | % by mass | 0.15 | 0.15 | 0.15 | 0.15 | 0.15 | 0.15 | 0.15 |
| Total thickness | | μm | 15 | 15 | 15 | 15 | 15 | 15 | 15 |
| Thickness of base layer | | μm | 12 | 12 | 12 | 12 | 12 | 12 | 12 |
| Inorganic thin film layer | | — | aluminum oxide | aluminum oxide | aluminum oxide + silicon dioxide | aluminum oxide + silicon dioxide | aluminum oxide + silicon dioxide | aluminum oxide + silicon dioxide | — |
| Haze | | % | 2.4 | 2.5 | 2.0 | 2.2 | — | 2.6 | 2.0 |
| Impact strength | | J/ 15 μm | 1.1 | 1.1 | 1.1 | 1.0 | — | 1.2 | 1.1 |
| Heat shrinkage rate | MD direction | % | 1.0 | 0.9 | 0.8 | 0.7 | — | 0.9 | 0.9 |
| | TD direction | % | 1.2 | 1.1 | 0.7 | 0.9 | — | 1.0 | 1.1 |
| Dynamic friction coefficient (F/B) | | — | 0.66 | 0.63 | 0.98 | 0.66 | — | 0.74 | 0.70 |
| Bending pinhole resistance | | piece | 5 | 3 | 23 | 15 | — | 2 | 5 |
| Friction pinhole resistance | | cm | 3200 | 3300 | 3300 | 3300 | — | 2500 | 3300 |
| Lamination strength | MD direction | N/ 15 mm | 7.0 | 6.8 | 4.8 | 6.8 | — | 4.5 | 6.9 |
| | TD direction | N/ 15 mm | 6.7 | 6.7 | 4.2 | 6.6 | — | 4.3 | 6.8 |
| Oxygen transmission rate | $ml/m^2 \cdot day \cdot MPa$ | | 46 | 45 | 27 | 26 | — | 22 | >500 |

As shown in Table 4, the gas-barrier film of each Example having an inorganic thin film layer had good bending pinhole resistance and friction pinhole resistance. In addition, the haze was low and the transparency was good, and the slipperiness was also good. Moreover, the impact strength was strong, and the lamination strength with the sealant film was high, so that the gas-barrier film was excellent as a packaging film.

The gas-barrier film of Comparative Example 3-1 Obtained from a biaxially stretched polyamide film containing no polyamide 11 and the gas-barrier film of Comparative Example 3-2 obtained from a biaxially stretched polyamide film having a low content of polyamide 11, had inferior bending pinhole resistance.

In Comparative Example 3-3, since the content of polyamide 11 was excessively high, the melted resin was not able to be stably extruded from the T-die into a film shape, so that a homogeneous unstretched film was not obtained, and a biaxially stretched polyamide film was not obtained.

In Comparative Example 3-4, when the polyamide elastomer which is conventionally used as a material for modifying bending pinhole resistance was used, the bending pinhole resistance was good, but the friction pinhole resistance was inferior. In addition, there is a drawback that deteriorated matter easily adheres to the die during production for a long time, so that continuous production for a long time is not possible.

In Comparative Example 3-5, since an inorganic thin film layer was not formed; the oxygen transmission rate was high, so that the gas-barrier polyamide film was not suitable for gas-barrier packaging.

Example 4-1 to Example 4-10

Biaxially stretched polyamide films and gas-barrier polyamide films were obtained in the same manner as Example 3-1, except that the raw material resin composition and the inorganic thin film layer were changed as shown in Table 5. The evaluation results of the obtained gas-barrier polyamide films are shown in Table 5.

However, in Example 4-8, similar to Example 1-6, an inorganic thin film layer of aluminum oxide was formed as an inorganic thin film layer.

Comparative Examples 1 to 6

Biaxially stretched polyamide films and gas-barrier polyamide films were obtained in the same manner as Example 4-1 with the raw material blending compositions shown in Table 5. The evaluation results of the obtained gas-barrier polyamide films are shown in Table 2.

In Comparative Example 4-2, an inorganic thin film layer was not formed in Comparative Example 4-1.

In Comparative Example 4-4, the melted resin was not able to be stably extruded from the T-die into a film shape, and a homogeneous unstretched film was not obtained, so that biaxial stretching was not able to be performed.

In Comparative Example 4-5, the structure of the feed block and the discharge quantities of the extruders were adjusted such that the biaxially stretched polyamide film had a total thickness of 15 μm, the base layer (layer A) had a thickness of 4 μm, and the surface layers (layers B) on the front and back sides each had a thickness of 5.5 μm, and the ratio of the thickness of the base layer was set to 20% of the total thickness.

In Comparative Example 4-6, a polyamide-based elastomer (manufactured by Arkema, PEBAX4033SA02) which is conventionally used as a modifier for bending pinhole resistance was blended.

TABLE 5

| | | | Example | | | | | | |
|---|---|---|---|---|---|---|---|---|---|
| | | | 4-1 | 4-2 | 4-3 | 4-4 | 4-5 | 4-6 | 4-7 |
| Composition of base layer | polyamide 6 | parts by mass | 97 | 95 | 90 | 85 | 75 | 95 | 95 |
| | polyamide 11 | parts by mass | 3 | 5 | 10 | 15 | 25 | 5 | 5 |
| | polyamide 410 | parts by mass | — | — | — | — | — | — | — |
| | polyamide 610 | parts by mass | — | — | — | — | — | — | — |
| | polyamide 1010 | parts by mass | — | — | — | — | — | — | — |
| | polyamide elastomer | parts by mass | — | — | — | — | — | — | — |
| Composition of functional layer | polyamide 6 | parts by mass | 95 | 95 | 97 | 95 | 95 | 90 | 100 |
| | polyamide MXD6 | parts by mass | 5 | 5 | 3 | 5 | 5 | 10 | — |
| | polyamide elastomer | parts by mass | — | — | — | — | — | — | — |
| | fine particle | parts by mass | 0.54 | 0.54 | 0.54 | 0.54 | 0.54 | 0.54 | 0.65 |
| | fatty acid amide | parts by mass | 0.15 | 0.15 | 0.15 | 0.15 | 0.15 | 0.15 | 0.20 |
| Total thickness | | μm | 15 | 15 | 15 | 15 | 15 | 15 | 15 |
| Ratio of thickness of base layer | | % | 80 | 80 | 80 | 80 | 80 | 80 | 80 |
| Lamination configuration | | — | B/A/B | B/A/B | B/A/B | B/A/B | B/A/B | B/A/B | B/A/B |
| Inorganic thin film layer | | — | aluminum oxide + silicon dioxide | aluminum oxide + silicon dioxide | aluminum oxide + silicon dioxide | aluminum oxide + silicon dioxide | aluminum oxide + silicon dioxide | aluminum oxide + silicon dioxide | aluminum oxide + silicon dioxide |
| Haze | | % | 2.4 | 2.7 | 2.7 | 3.2 | 4.8 | 2.6 | 2.6 |
| Dynamic friction coefficient | | — | 0.66 | 0.63 | 0.74 | 0.66 | 0.67 | 0.65 | 0.68 |
| Impact strength | | J/15 μm | 1.1 | 1.3 | 1.0 | 1.4 | 1.1 | 1.4 | 1.4 |
| Biomass degree | | % | 2 | 4 | 8 | 12 | 20 | 4 | 4 |
| Bending pinhole resistance | | piece | 6 | 4 | 4 | 4 | 4 | 4 | 4 |
| Friction pinhole resistance | | cm | 3400 | 3400 | 3200 | 3200 | 3400 | 3400 | 3500 |
| Heat shrinkage rate | MD direction | % | 0.8 | 0.9 | 0.9 | 1.0 | 1.3 | 0.3 | 0.9 |
| | TD direction | % | 1.0 | 1.0 | 1.1 | 1.2 | 1.3 | 1.6 | 1.0 |
| Lamination strength | MD direction | N/mm | 7.0 | 6.9 | 7.2 | 7.3 | 7.2 | 6.9 | 6.7 |
| | TD direction | N/mm | 6.6 | 6.8 | 6.8 | 7.2 | 7.2 | 6.5 | 6.6 |
| Water-Resistant Lamination Strength | MB direction | N/mm | 3.0 | 3.3 | 3.2 | 3.3 | 3.3 | 3.2 | 3.1 |
| | TD direction | N/mm | 2.9 | 2.9 | 2.9 | 2.9 | 2.8 | 2.9 | 2.9 |
| Oxygen transmission rate | $ml/m^2 \cdot day \cdot MPa$ | | 23 | 26 | 22 | 24 | 28 | 22 | 26 |

| | | | Example | | | | Comparative Example | |
|---|---|---|---|---|---|---|---|---|
| | | | 4-8 | 4-9 | 4-10 | 4-11 | 4-1 | 4-2 |
| Composition of base layer | polyamide 6 | parts by mass | 95 | 85 | 85 | 85 | 100 | 100 |
| | polyamide 11 | parts by mass | 5 | — | — | — | — | — |
| | polyamide 410 | parts by mass | — | 15 | — | — | — | — |
| | polyamide 610 | parts by mass | — | — | 15 | — | — | — |
| | polyamide 1010 | parts by mass | — | — | — | 15 | — | — |
| | polyamide elastomer | parts by mass | — | — | — | — | — | — |
| Composition of functional layer | polyamide 6 | parts by mass | 95 | 95 | 95 | 95 | 100 | 100 |
| | polyamide MXD6 | parts by mass | 5 | 5 | 5 | 5 | — | — |
| | polyamide elastomer | parts by mass | — | — | — | — | — | — |
| | fine particle | parts by mass | 0.54 | 0.54 | 0.54 | 0.54 | 0.54 | 0.54 |
| | fatty acid amide | parts by mass | 0.15 | 0.15 | 0.15 | 0.15 | 0.15 | 0.15 |
| Total thickness | | μm | 15 | 15 | 15 | 15 | 15 | 15 |
| Ratio of thickness of base layer | | % | 80 | 80 | 80 | 80 | 80 | 80 |
| Lamination configuration | | — | B/A/B | B/A/B | B/A/B | B/A/B | B/A/B | B/A/B |
| Inorganic thin film layer | | — | aluminum oxide | aluminum oxide + silicon dioxide | aluminum oxide + silicon dioxide | aluminum oxide + silicon dioxide | aluminum oxide + silicon dioxide | None |
| Haze | | % | 2.6 | 3.4 | 3.3 | 3.3 | 2.2 | 2.2 |
| Dynamic friction coefficient | | — | 0.63 | 0.67 | 0.68 | 0.64 | 1.04 | 1.07 |
| Impact strength | | J/15 μm | 1.4 | 1.2 | 1.2 | 1.2 | 0.9 | 1.2 |
| Biomass degree | | % | 4 | 9 | 8 | 6 | 0 | 0 |
| Bending pinhole resistance | | piece | 4 | 5 | 5 | 6 | 23 | 11 |
| Friction pinhole resistance | | cm | 3400 | 3500 | 3200 | 3400 | 2700 | 3300 |
| Heat shrinkage rate | MD direction | % | 0.9 | 1.2 | 1.3 | 1.4 | 0.8 | 1.3 |
| | TD direction | % | 1.0 | 1.4 | 1.5 | 1.6 | 0.7 | 1.4 |
| Lamination strength | MD direction | N/mm | 6.9 | 6.9 | 6.9 | 7.1 | 7.1 | 3.3 |
| | TD direction | N/mm | 6.5 | 6.7 | 6.7 | 6.8 | 7.1 | 3.0 |
| Water-Resistant Lamination Strength | MB direction | N/mm | 3.3 | 3.0 | 3.3 | 3.3 | 3.3 | 1.2 |
| | TD direction | N/mm | 2.9 | 2.9 | 2.7 | 2.8 | 2.7 | 2.9 |
| Oxygen transmission rate | $ml/m^2 \cdot day \cdot MPa$ | | 46 | 25 | 23 | 24 | 27 | >500 |

TABLE 5-continued

| | | | Comparative Example 4-3 | 4-4 | 4-5 | 4-6 |
|---|---|---|---|---|---|---|
| Composition of base layer | polyamide 6 | parts by mass | 95.5 | 65 | 95 | 97 |
| | polyamide 11 | parts by mass | 0.5 | 35 | 5 | — |
| | polyamide 410 | parts by mass | — | — | — | — |
| | polyamide 610 | parts by mass | — | — | — | — |
| | polyamide 1010 | parts by mass | — | — | — | — |
| | polyamide elastomer | parts by mass | — | — | — | 3 |
| Composition of functional layer | polyamide 6 | parts by mass | 95 | 95 | 95 | 97 |
| | polyamide MXD6 | parts by mass | 5 | 5 | 5 | — |
| | polyamide elastomer | parts by mass | — | — | — | 3 |
| | fine particle | parts by mass | 0.54 | 0.54 | 0.54 | 0.54 |
| | fatty acid amide | parts by mass | 0.15 | 0.15 | 0.15 | 0.15 |
| Total thickness | | μm | 15 | 15 | 15 | 15 |
| Ratio of thickness of base layer | | % | 80 | 80 | 20 | 80 |
| Lamination configuration | | — | B/A/B | B/A/B | B/A/B | B/A/B |
| Inorganic thin film layer | | — | aluminum oxide + silicon dioxide | — | aluminum oxide + silicon dioxide | aluminum oxide + silicon dioxide |
| Haze | | % | 2.3 | — | 3.0 | 2.2 |
| Dynamic friction coefficient | | — | 0.66 | — | 0.65 | 0.79 |
| Impact strength | | J/15 μm | 1.0 | — | 1.2 | 1.2 |
| Biomass degree | | % | 0.1 | 28 | 1 | 0 |
| Bending pinhole resistance | | piece | 14 | — | 22 | 3 |
| Friction pinhole resistance | | cm | 2700 | — | 2900 | 2600 |
| Heat shrinkage rate | MD direction | % | 0.7 | — | 1.0 | 1.1 |
| | TD direction | % | 0.9 | — | 0.9 | 1.3 |
| Lamination strength | MD direction | N/mm | 6.8 | — | 6.7 | 4.2 |
| | TD direction | N/mm | 6.8 | — | 6.7 | 4.0 |
| Water-Resistant Lamination Strength | MB direction | N/mm | 1.5 | — | 1.4 | 1.3 |
| | TD direction | N/mm | 1.5 | — | 1.2 | 1.1 |
| Oxygen transmission rate | $ml/m^2 \cdot day \cdot MPa$ | | 24 | — | 25 | 28 |

As shown in Table 5, the gas-barrier polyamide film of each Example had a low oxygen transmission rate and excellent gas barrier properties, and had both excellent bending pinhole resistance and excellent friction pinhole resistance. In addition, the haze was low, the transparency was good, and the lamination strength with the sealant film was high, so that the gas-barrier polyamide film was excellent as a packaging film.

In the cases of Comparative Example 4-1 and Comparative Example 4-2 in which the base layer did not contain a polyamide resin in which at least a part of raw material is derived from biomass and in the case of Comparative Example 4-3 in which the content of polyamide 11 was excessively low, the bending pinhole resistance was inferior. In Comparative Example 2, since an inorganic thin film layer was not formed, the oxygen transmission rate was high.

In Comparative Example 4-4, since the content of polyamide 11 was excessively high, the melted resin was not able to be stably extruded from the T-die into a film shape, so that a homogeneous unstretched film was not obtained, and a biaxially stretched polyamide film was not obtained.

In Comparative Example 4-5, since the ratio of the thickness of the base layer (layer A) was small, the bending pinhole resistance was poor.

In Comparative Example 4-6, the polyamide elastomer which is conventionally used as a material for modifying bending pinhole resistance was used. The obtained gas-barrier polyamide film had good bending pinhole resistance but inferior friction pinhole resistance.

INDUSTRIAL APPLICABILITY

Since the gas-barrier polyamide film of the present invention is a gas-barrier film having excellent bending pinhole resistance and friction pinhole resistance at the same time, the gas-barrier polyamide film is suitable for use for packaging materials that require gas barrier properties such as food packaging. Furthermore, since a resin polymerized from a biomass-derived raw material that originally exists on the ground is used, the gas-barrier polyamide film is a carbon-neutral film, and the environmental load can be reduced in terms of having little effect on increase and decrease of carbon dioxide on the ground.

The invention claimed is:

1. A gas-barrier polyamide film comprising an inorganic thin film layer on at least one surface of a biaxially stretched polyamide film in which a functional layer (layer B) is laminated on at least one surface of a base layer (layer A), wherein the base layer (layer A) contains 99 to 70% by mass of a polyamide 6 resin, 1 to 30% by mass of a polyamide 11 resin in which at least a part of raw material is derived from biomass, and optionally a thermoplastic resin other than the polyamide 6 resin and the polyamide 11 resin, and the functional layer (layer B) contains a polyamide MXD6 resin and 70% by mass or more of the polyamide 6 resin, the thermoplastic resin other than the polyamide 6 and the polyamide 11 resin is selected from the group consisting of a polyamide 12 resin, a polyamide 6/12 copolymer resin, a polyamide 6/66 copolymer resin, a polyamide MXD6 resin, a polyester-based polymer, and a polyolefin-based polymer, the base layer (layer A) and the functional layer (layer B) do not contain a polyamide-based elastomer or a polyolefin-based elastomer, and the inorganic thin film layer is laminated on the functional layer (layer B) and consists of metal, inorganic oxide, or a combination thereof.

2. The gas-barrier polyamide film according to claim 1, wherein a content of carbon derived from biomass as measured with radiocarbon ($C^{14}$) is 1 to 15% with respect to total carbon in the biaxially stretched polyamide film.

3. The gas-barrier polyamide film according to claim 1, wherein the gas-barrier polyamide film satisfies the following (a) and (b):

(a) the number of Gelbo pinhole defects is not larger than 10 when a torsional bending test using a Gelbo flex tester is performed 1000 times at a temperature of 1° C., and (b) a distance to occurrence of a pinhole in a friction-resistant pinhole test is not less than 2900 cm.

4. The gas-barrier film according to claim 1, wherein the inorganic thin film layer consists of aluminum oxide or a composite oxide of silicon oxide and aluminum oxide.

5. A laminated film in which a sealant film is laminated on the gas-barrier polyamide film according to claim 1.

6. A packaging bag for which the laminated film according to claim 5 is used.

7. The gas-barrier polyamide film according to claim 1, wherein the base layer (layer A) contains a thermoplastic resin other than the polyamide 6 resin and the polyamide 11 resin, wherein the thermoplastic resin other than the polyamide 6 and the polyamide 11 resin is selected from the group consisting of a polyamide 12 resin, a polyamide 6/12 copolymer resin, a polyamide 6/66 copolymer resin, a polyamide MXD6 resin, a polyester-based polymer, and a polyolefin-based polymer.

8. The gas-barrier film according to claim 1, wherein the functional layer (layer B) is laminated on both surfaces of the base layer (layer A).

9. The gas-barrier film according to claim 1, wherein the gas-barrier polyamide film comprising a configuration of the inorganic thin film layer/the functional layer (layer B)/the base layer (layer A)/the functional layer (layer B).

* * * * *